US012652868B2

(12) United States Patent     (10) Patent No.:   US 12,652,868 B2

Wang et al.             (45) Date of Patent:      Jun. 9, 2026

(54) PHOTOSENSITIVE TRANSISTOR, METHOD FOR MANUFACTURING A PHOTOSENSITIVE TRANSISTOR, AND MICROFLUIDIC CHIP

(71) Applicant: Shanghai Tianma Microelectronics Co., Ltd., Shanghai (CN)

(72) Inventors: Linzhi Wang, Shanghai (CN); Kerui Xi, Shanghai (CN); Kaidi Zhang, Shanghai (CN); Shun Gong, Shanghai (CN); Yukun Huang, Shanghai (CN)

(73) Assignee: Shanghai Tianma Microelectronics Co., Ltd., Shanghai (CN)

( * ) Notice: Subject to any disclaimer, the term of this patent is extended or adjusted under 35 U.S.C. 154(b) by 411 days.

(21) Appl. No.: 18/142,114

(22) Filed: May 2, 2023

(65) Prior Publication Data

US 2023/0268449 A1     Aug. 24, 2023

(30) Foreign Application Priority Data

Nov. 11, 2022    (CN) .......................... 202211414940.6

(51) Int. Cl.
*H10F 39/10*       (2025.01)
*H10F 30/282*     (2025.01)
        (Continued)

(52) U.S. Cl.
CPC ......... *H10F 39/107* (2025.01); *H10F 30/282* (2025.01); *H10F 39/8023* (2025.01);
        (Continued)

(58) Field of Classification Search
CPC .... H10F 30/282; H10F 39/107; H10F 39/802; H10F 39/8023; H10F 39/8027;
        (Continued)

(56) References Cited

U.S. PATENT DOCUMENTS

2009/0266973 A1* 10/2009 Roy ...................... H10F 39/026
                                     250/206
2014/0183685 A1* 7/2014 Roy .................... H10F 39/1865
                                     257/443

(Continued)

FOREIGN PATENT DOCUMENTS

CN      102832269 A    12/2012
CN      109950358 A     6/2019

*Primary Examiner* — Yara B Green
*Assistant Examiner* — Christopher M Roland
(74) *Attorney, Agent, or Firm* — KDW FIRM PLLC

(57) ABSTRACT

A photosensitive transistor includes a substrate and a first semiconductor layer, a first gate, a first electrode, a second electrode and a second semiconductor layer which are located on a side of the substrate. The first semiconductor layer includes a first doped region, a second doped region and a channel region, the second semiconductor layer is in direct contact with the channel region, and an area of the second semiconductor layer is less than an area of the first semiconductor layer. The photosensitive transistor includes a main region and opening regions, and the opening regions are located at a periphery of the main region. The first electrode and the second electrode are in the same layer and insulated from each other and both surround the main region. The second semiconductor layer includes a main body portion located in the main region and auxiliary portions located in the opening regions.

20 Claims, 19 Drawing Sheets

(51) Int. Cl.

| | |
|---|---|
| *H10F 39/00* | (2025.01) |
| *H10F 71/10* | (2025.01) |
| *H10F 77/14* | (2025.01) |
| *H10F 77/20* | (2025.01) |

(52) U.S. Cl.
CPC ..... *H10F 39/8027* (2025.01); *H10F 39/8033* (2025.01); *H10F 39/8037* (2025.01); *H10F 71/103* (2025.01); *H10F 77/14* (2025.01); *H10F 77/206* (2025.01)

(58) Field of Classification Search
CPC .. H10F 39/8033; H10F 39/8037; H10F 77/14; H10F 77/206; H10F 77/215
See application file for complete search history.

(56) References Cited

U.S. PATENT DOCUMENTS

| | | | |
|---|---|---|---|
| 2017/0125474 A1* | 5/2017 | Roy | H10F 39/151 |
| 2021/0193849 A1* | 6/2021 | Tournier | H10F 39/802 |

* cited by examiner

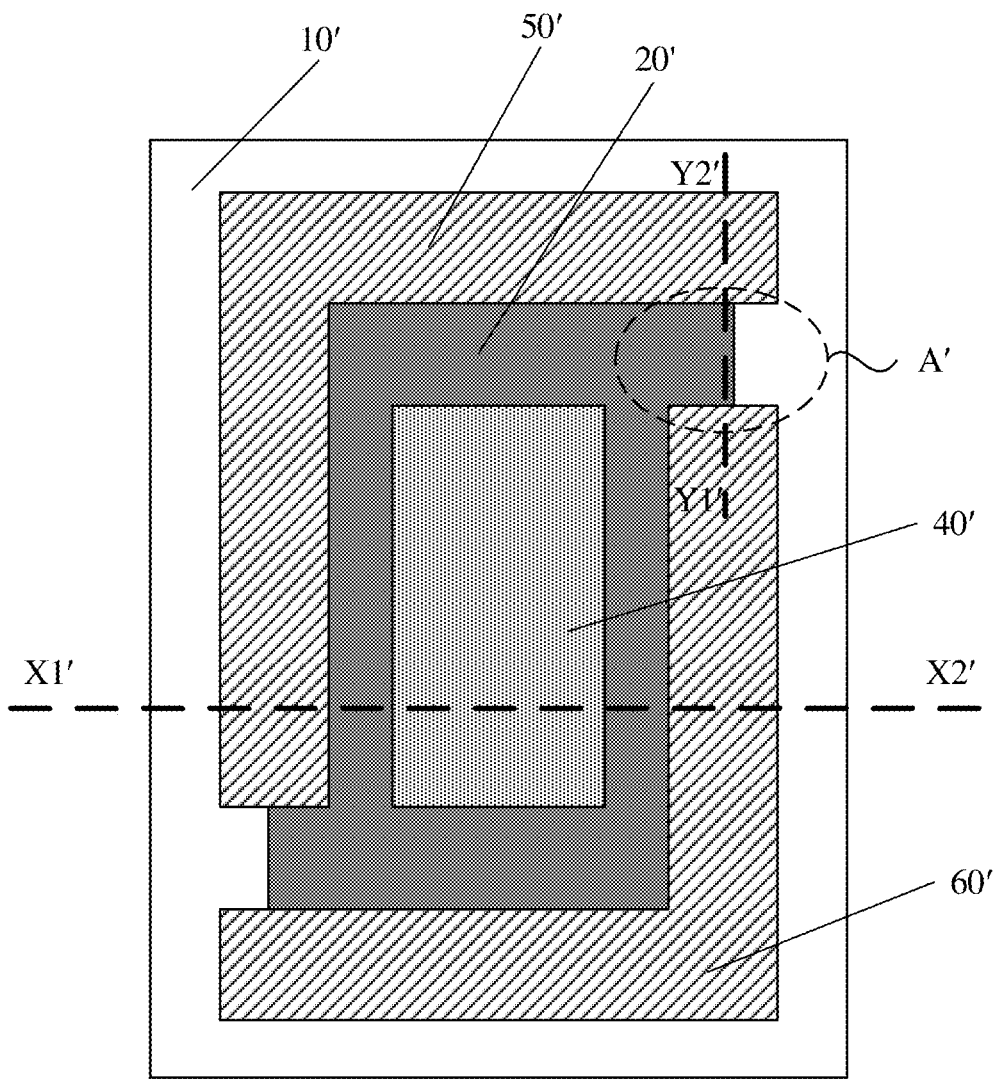
*(Prior Art)* FIG. 1
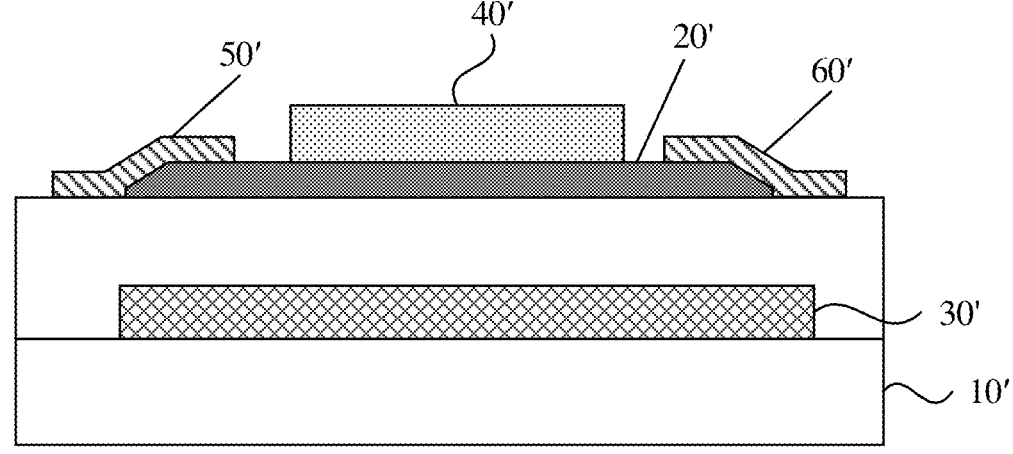
*(Prior Art)* FIG. 2

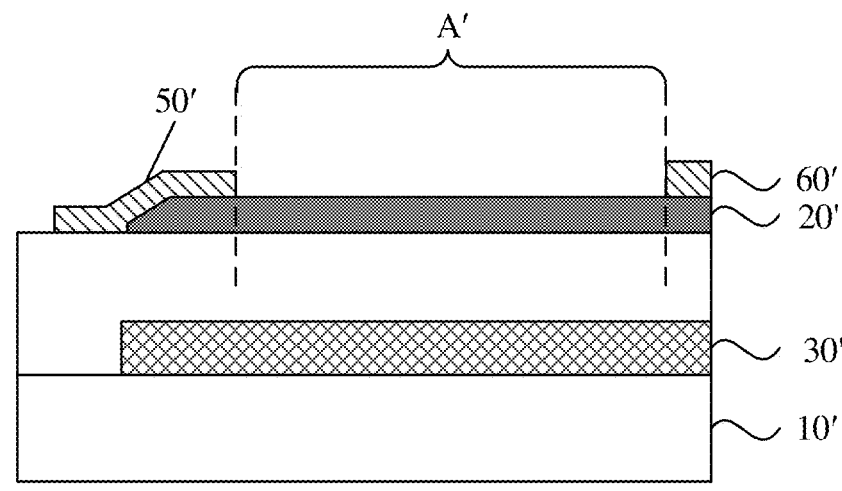
(*Prior Art*) FIG. 3

100

100

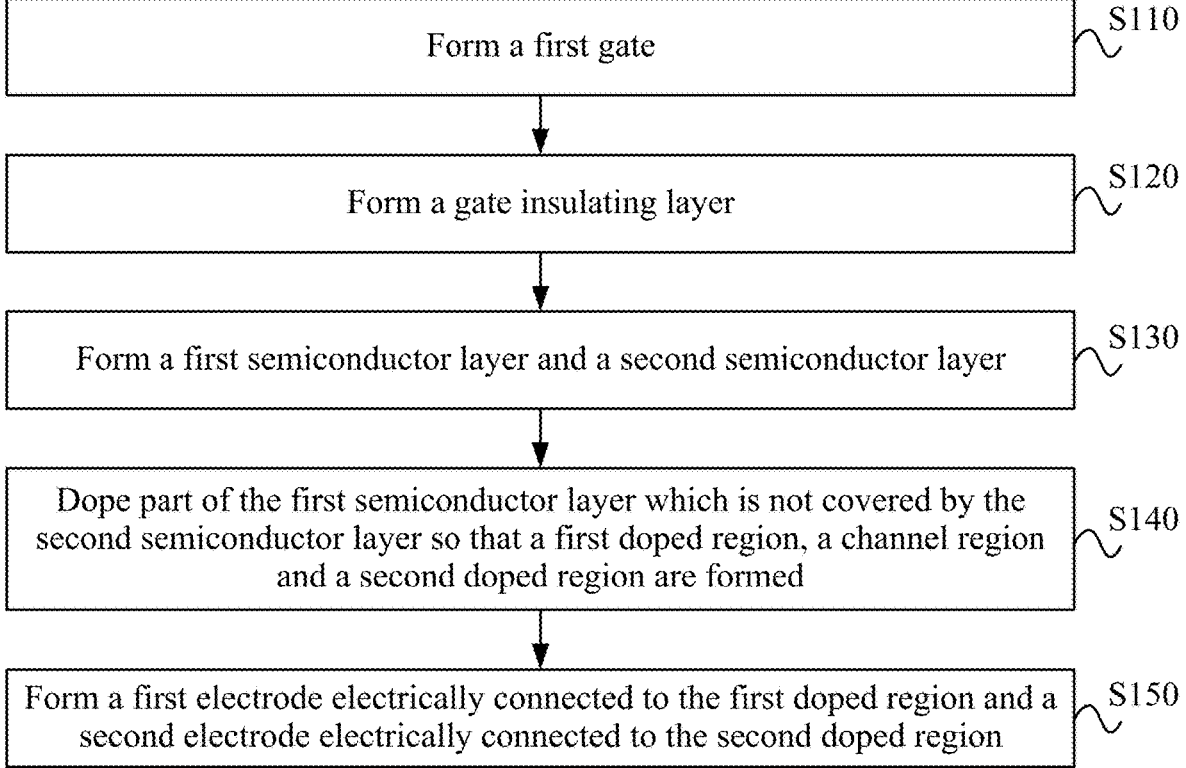

| Form a first gate | S110 |
| Form a gate insulating layer | S120 |
| Form a first semiconductor layer and a second semiconductor layer | S130 |
| Dope part of the first semiconductor layer which is not covered by the second semiconductor layer so that a first doped region, a channel region and a second doped region are formed | S140 |
| Form a first electrode electrically connected to the first doped region and a second electrode electrically connected to the second doped region | S150 |

FIG. 19

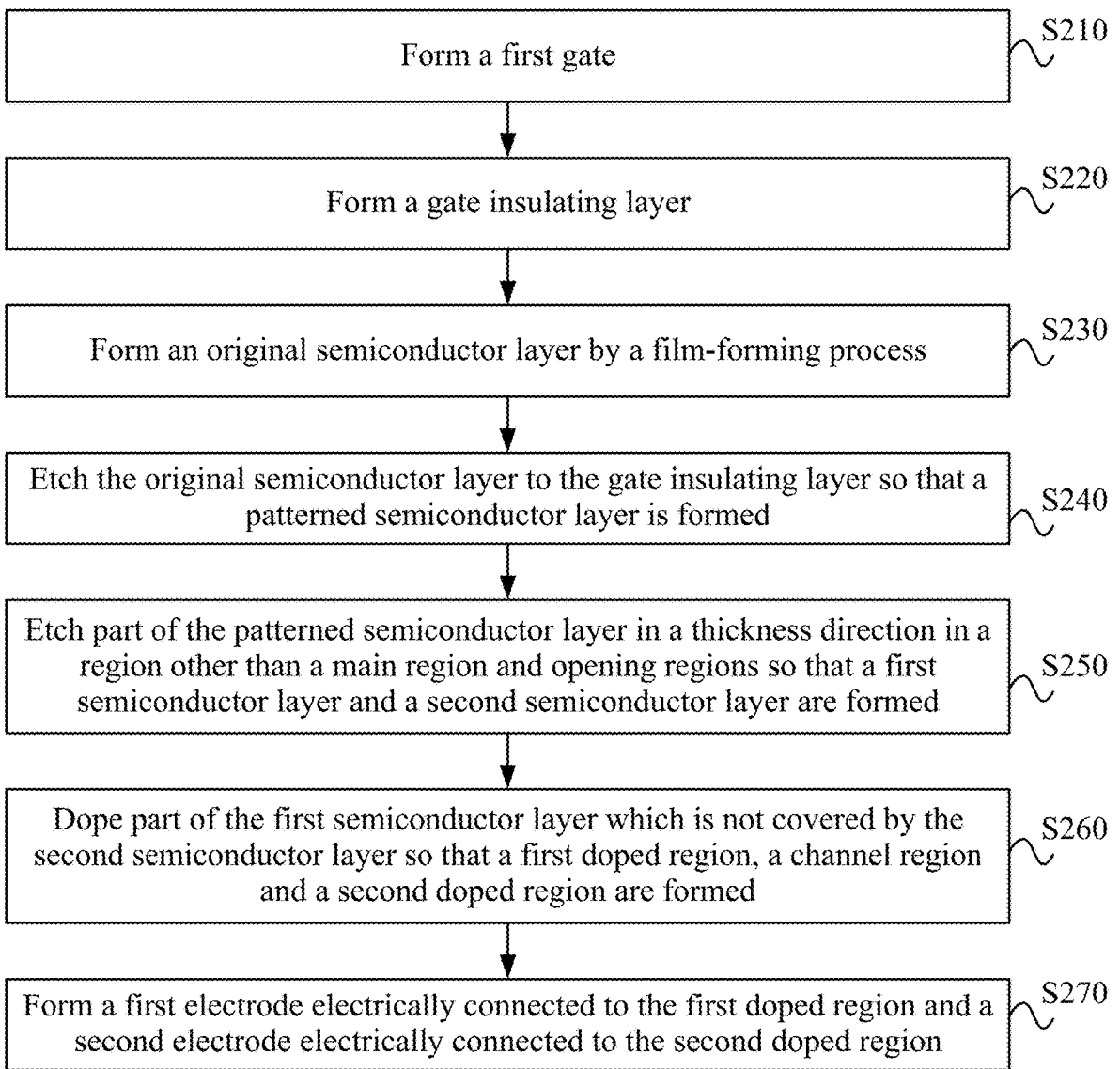

| | |
|---|---|
| Form a first gate | S210 |
| Form a gate insulating layer | S220 |
| Form an original semiconductor layer by a film-forming process | S230 |
| Etch the original semiconductor layer to the gate insulating layer so that a patterned semiconductor layer is formed | S240 |
| Etch part of the patterned semiconductor layer in a thickness direction in a region other than a main region and opening regions so that a first semiconductor layer and a second semiconductor layer are formed | S250 |
| Dope part of the first semiconductor layer which is not covered by the second semiconductor layer so that a first doped region, a channel region and a second doped region are formed | S260 |
| Form a first electrode electrically connected to the first doped region and a second electrode electrically connected to the second doped region | S270 |

PHOTOSENSITIVE TRANSISTOR, METHOD FOR MANUFACTURING A PHOTOSENSITIVE TRANSISTOR, AND MICROFLUIDIC CHIP

CROSS-REFERENCE TO RELATED APPLICATION

This application claims priority to Chinese Patent Application No. 202211414940.6, filed on Nov. 11, 2022, the disclosure of which is incorporated herein by reference in its entirety.

TECHNICAL FIELD

The present disclosure relates to the technical field of photoelectric detection, in particular, to a photosensitive transistor and a method for manufacturing a photosensitive transistor, a detector, a display and a microfluidic chip.

BACKGROUND

Photosensitive transistors are widely used in many fields such as photodetectors and optical touch screens due to high sensitivity and good reliability.

The photosensitive transistor in the related art has poor stability due to the uneven structure of various parts of the photosensitive transistor caused by structural defects of the photosensitive transistor. Moreover, for the photosensitive transistor in the related art, the area covered by the photosensitive layer is relatively small, so that certain positions of the photosensitive transistor generate less photogenerated carriers under illumination, so that the overall photoelectric gain of the photosensitive transistor is reduced, resulting in the insufficient sensitivity of the photosensitive transistor.

SUMMARY

The present disclosure provides a photosensitive transistor and a method for manufacturing a photosensitive transistor, a detector, a display and a microfluidic chip, so as to improve the stability of the photosensitive transistor and the sensitivity of photoelectric detection by the photosensitive transistor.

According to an aspect of the present disclosure, a photosensitive transistor is provided. The photosensitive transistor includes a substrate and a first semiconductor layer, a first gate, a first electrode, a second electrode and a second semiconductor layer which are located on a side of the substrate.

The first semiconductor layer includes a first doped region, a second doped region and a channel region, and the channel region is located between the first doped region and the second doped region.

The first electrode is electrically connected to the first doped region, the second electrode is electrically connected to the second doped region, and in a direction perpendicular to the substrate, the first gate is insulated from and overlaps the channel region.

The second semiconductor layer is in direct contact with the channel region, and an area of the second semiconductor layer is less than an area of the first semiconductor layer.

The photosensitive transistor includes a main region and opening regions, and the opening regions are located at a periphery of the main region; the first electrode and the second electrode are in the same layer and insulated from each other and both surround the main region; and a region between an end portion of the first electrode and the second electrode and a region between an end portion of the second electrode and the first electrode each form an opening region.

The second semiconductor layer includes a main body portion and auxiliary portions, where the main body portion is located in the main region, and each of the auxiliary portions is located in an opening region of the opening regions.

According to another aspect of the present disclosure, a method for manufacturing a photosensitive transistor is provided and includes steps described below.

A first gate is formed.

A gate insulating layer is formed.

A first semiconductor layer and a second semiconductor layer are formed, where an area of the second semiconductor layer is less than an area of the first semiconductor layer.

Doping is performed on part of the first semiconductor layer which is not covered by the second semiconductor layer so that a first doped region, a channel region and a second doped region are formed, where the channel region is located between the first doped region and the second doped region.

A first electrode electrically connected to the first doped region and a second electrode electrically connected to the second doped region are formed.

The photosensitive transistor includes a main region and opening regions, and the opening regions are located at a periphery of the main region; the first electrode and the second electrode are in the same layer and insulated from each other and both surround the main region; and a region between an end portion of the first electrode and the second electrode and a region between an end portion of the second electrode and the first electrode each form an opening region.

The second semiconductor layer includes a main body portion and auxiliary portions, where the main body portion is located in the main region, and each of the auxiliary portions is located in an opening region of the opening regions.

According to another aspect of the present disclosure, a photoelectric detector is provided. The photoelectric detector includes the preceding photosensitive transistor.

According to another aspect of the present disclosure, a photoelectric detector is provided. The photoelectric detector includes the preceding photosensitive transistor.

According to another aspect of the present disclosure, a microfluidic chip is provided. The microfluidic chip includes multiple pixel regions arranged in rows and columns, a microfluidic electrode and the preceding photosensitive transistor.

The microfluidic electrode is located in a pixel region on a side of a substrate and is configured to drive a liquid drop to move.

The photosensitive transistor is located in a pixel region on the side of the substrate.

According to the photosensitive transistor provided in embodiments of the present disclosure, the second semiconductor layer includes the main body portion disposed in the main region and the auxiliary portions disposed in the opening region between the end portion of the first electrode and the second electrode and in the opening region between the end portion of the second electrode and the first electrode. Therefore, on the one hand, a relatively large photocurrent is generated when light is received, so that a relatively large shift of the threshold voltage of the photosensitive transistor is generated, and the sensitivity of photoelectric detection by the photosensitive transistor can be effectively improved; on the other hand, it can be ensured that the channel structure of the main region and the channel structure of the opening regions remain uniform, that is, it can be ensured that the overall structure of the photosensitive transistor is uniform, so that the stability of the device can be effectively improved. In addition, the first semiconductor layer includes the first doped region and the second doped region which have a better conductivity, so that the current flowing in the channel region can be efficiently transmitted to the first electrode through the first doped region, or transmitted to the second electrode through the second doped region, and thus the current transmission efficiency of the photosensitive transistor can be effectively improved.

It is to be understood that the content described in this part is not intended to identify key or important features of the embodiments of the present disclosure and is not intended to limit the scope of the present disclosure. Other features of the present disclosure will become readily understood through the description hereinafter.

BRIEF DESCRIPTION OF DRAWINGS

To illustrate technical solutions in embodiments of the present disclosure more clearly, drawings used in description of the embodiments will be briefly described below. Apparently, the drawings described below illustrate the embodiments of the present disclosure, and those of ordinary skill in the art may obtain other drawings based on the drawings described below without creative work.

FIG. 1 is a top view illustrating the structure of film layers of a photosensitive device in the related art;

FIG. 2 is a cross-sectional view taken along the line X1'-X2' of FIG. 1;

FIG. 3 is a cross-sectional view taken along the line Y1'-Y2' of FIG. 1;

FIG. 19 is a flowchart of a method for manufacturing a photosensitive transistor according to an embodiment of the present disclosure;

FIG. 21 is a flowchart of another method for manufacturing a photosensitive transistor according to an embodiment of the present disclosure;

DETAILED DESCRIPTION

Figure 4:
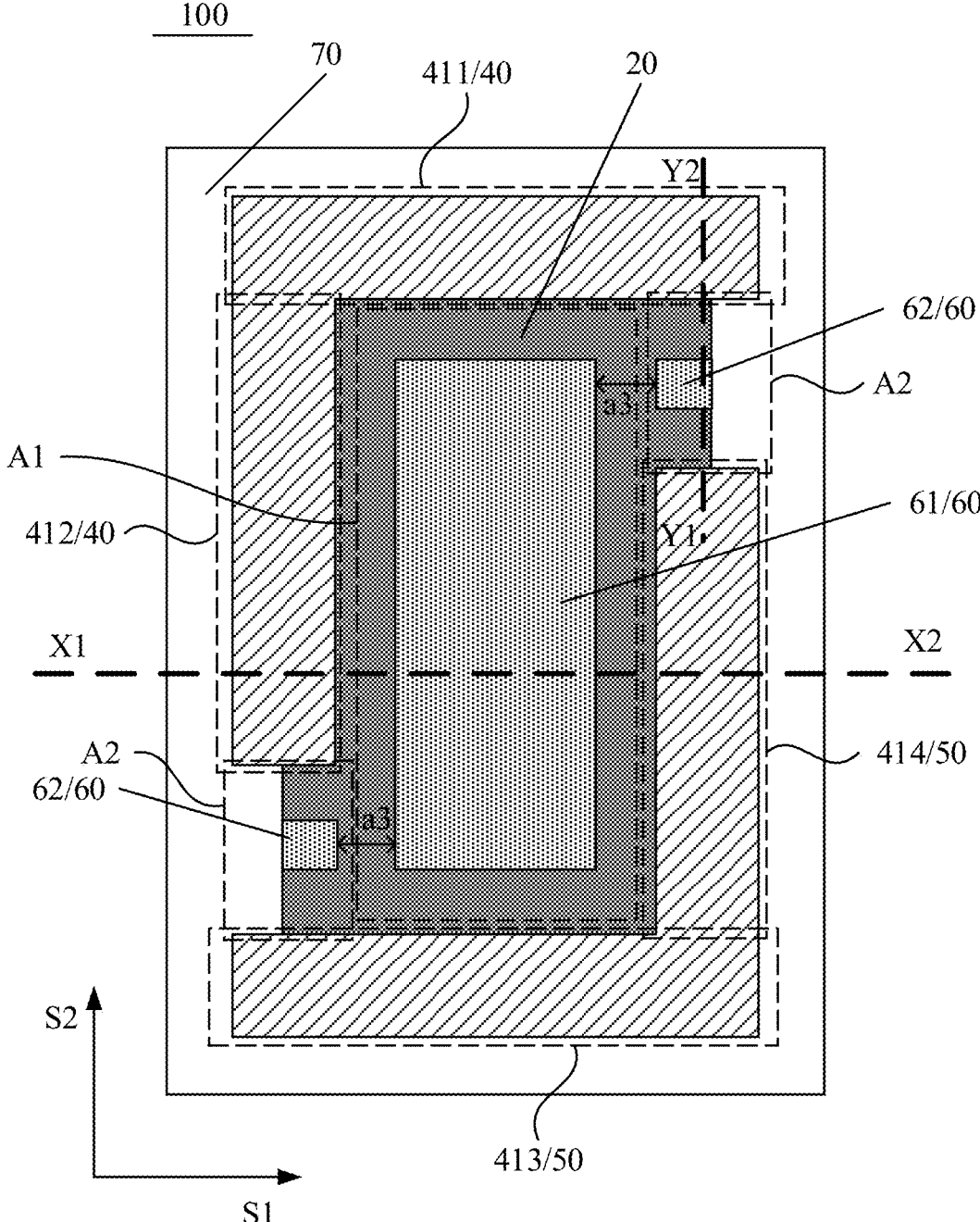
FIG. 4 is a top view illustrating the structure of film layers of a photosensitive device according to an embodiment of the present disclosure.

The technical solutions in embodiments of the present disclosure will be described clearly and completely in conjunction with the drawings in the embodiments of the present disclosure so that the solutions of the present disclosure will be better understood by those skilled in the art. Apparently, the embodiments described below are part, not all, of the embodiments of the present disclosure. Based on the embodiments described in the present disclosure, all other embodiments obtained by those of ordinary skill in the art on the premise that no creative work is done are within the scope of the present disclosure.

It is to be noted that the terms "first", "second" and the like in the description, claims and drawings of the present disclosure are used for distinguishing between similar objects and are not necessarily used for describing a particular order or sequence. It should be understood that the data used in this manner is interchangeable in appropriate cases so that the embodiments of the present disclosure described here may also be implemented in a sequence not illustrated or described here. In addition, the terms "comprising", "including" or any other variations thereof are intended to encompass a non-exclusive inclusion. For example, a process, method, system, product or device that includes a series of steps or elements not only includes the expressly listed steps or elements but may also include other steps or elements that are not expressly listed or are inherent to such a process, method, system, product or device.

FIG. 1 is a top view illustrating the structure of film layers of a photosensitive device in the related art, FIG. 2 is a cross-sectional view taken along the line X1'-X2' of FIG. 1, and FIG. 3 is a cross-sectional view taken along the line Y1'-Y2' of FIG. 1. Referring to FIG. 1, FIG. 2 and FIG. 3, a photosensitive transistor includes a gate 20', a first semiconductor layer 20', a second semiconductor layer 40', a source 50' and a drain 60' which are located on a side of a substrate 10'. The first semiconductor layer 20' is located on a side of the gate 30' away from the substrate 10' and is disposed insulated from the gate 20', and both the source 50' and the drain 60' are electrically connected to the first semiconductor layer 20'. The second semiconductor layer 40' generates a photocurrent when there is light; and in general, the stronger the light is, the larger the photocurrent is. The photocurrent is transmitted to the first semiconductor layer 20' and transmitted to the drain 60' through the first semiconductor layer 20', so that a current signal can be output according to the optical signal.

It can be seen from FIG. 1 that an opening region A' between the source 50' and the drain 60' is not provided in the second semiconductor layer 40', so that the opening region A' can only generate less photocurrent through the first semiconductor layer 20' when there is light; as a result, the photoelectric gain of the whole photosensitive transistor is reduced, and the sensitivity of the photosensitive transistor is insufficient. In addition, the opening region A' is not provided in the second semiconductor layer 40' but non-opening regions are provided in the second semiconductor layer 40', so that structures of different positions of the channel of the photosensitive transistor are not uniform, resulting in poor stability of the photosensitive transistor device.

To solve the preceding problem, an embodiment of the present disclosure provides a photosensitive transistor. The photosensitive transistor includes a substrate and a first semiconductor layer, a first gate, a first electrode, a second electrode and a second semiconductor layer which are located on a side of the substrate. The first semiconductor layer includes a first doped region, a second doped region and a channel region, where the channel region is located between the first doped region and the second doped region. The first electrode is electrically connected to the first doped region, the second electrode is electrically connected to the second doped region, and in a direction perpendicular onto the substrate, the first gate is insulated from and overlaps the channel region. The second semiconductor layer is in direct contact with the channel region, and an area of the second semiconductor layer is less than an area of the first semiconductor layer. The photosensitive transistor includes a main region and opening regions, and the opening regions are located at a periphery of the main region. In an example, a region surrounded and formed by the first electrode and the second electrode includes a main region and opening regions. The first electrode and the second electrode are in the same layer and insulated from each other and both surround the main region. A region between an end portion of the first electrode and the second electrode and a region between an end portion of the second electrode and the first electrode each form an opening region. The second semiconductor layer includes a main body portion and auxiliary portions, where the main body portion is located in the main region, and each of the auxiliary portions are located in the opening region.

In the preceding technical solution, the second semiconductor layer includes the main body portion disposed in the main region and the auxiliary portions disposed in the opening region between the end portion of the first electrode and the second electrode and in the opening region between the end portion of the second electrode and the first electrode. Therefore, on the one hand, a relatively large photocurrent is generated when light is received, so that a relatively large shift of the threshold voltage of the photosensitive transistor is generated, and the sensitivity of photoelectric detection by the photosensitive transistor can be effectively improved. Electron-hole pairs, that is, carriers, generated by the second semiconductor layer under illumination enter the first semiconductor layer, so that the conductivity of the first semiconductor layer is increased. In addition, the second semiconductor layer does not form a channel, and thus has high light absorption efficiency and good regulation performance. On the other hand, it can be ensured that the channel structure of the main region and the channel structures of the opening regions remain uniform, that is, it can be ensured that the overall structure of the photosensitive transistor is uniform, so that the stability of the device can be effectively improved. In addition, the first semiconductor layer includes the first doped region and the second doped region which have a better conductivity, so that the current flowing in the channel region can be efficiently transmitted to the first electrode through the first doped region, or transmitted to the second electrode through the second doped region, and thus the current transmission efficiency of the photosensitive transistor can be effectively improved.

The preceding is the core idea of the present application. Technical solutions in the embodiments of the present disclosure are described clearly and completely below in conjunction with the drawings in the embodiments of the present disclosure. Apparently, the embodiments described below are part, not all, of the embodiments of the present disclosure. Based on the embodiments of the present disclosure, all other embodiments obtained by those of ordinary skill in the art without creative work are within the scope of the present disclosure.

Figure 5:
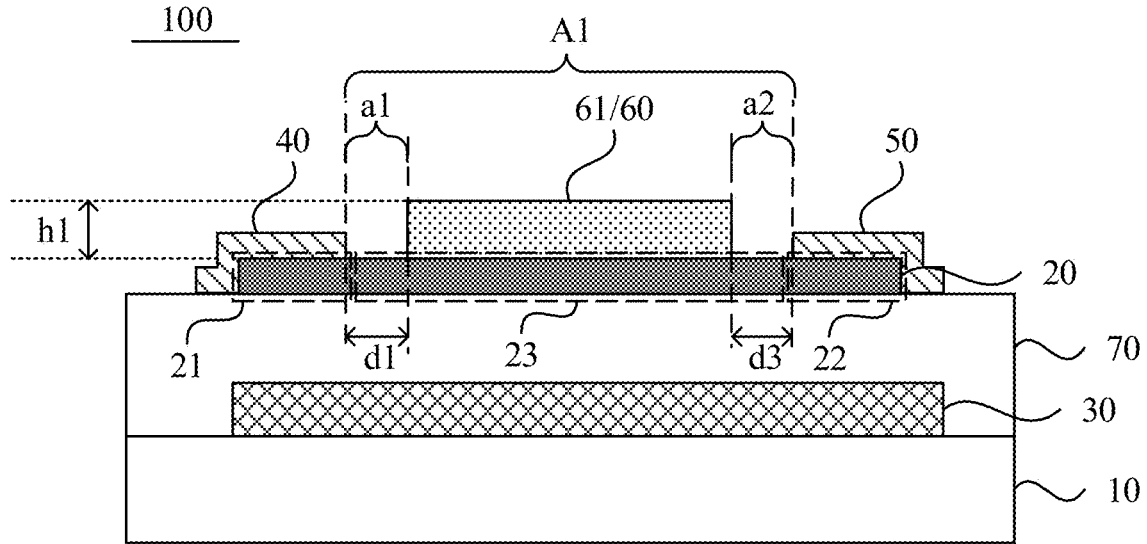
FIG. 5 is a cross-sectional view taken along the line X1-X2 of FIG. 4.
Figure 6:
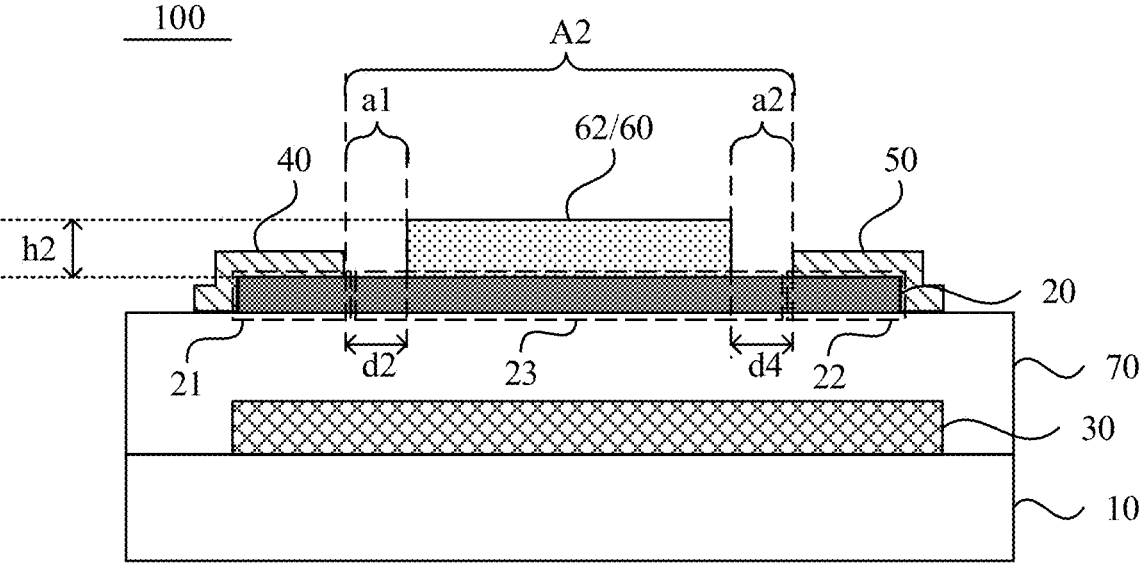
FIG. 6 is a cross-sectional view taken along the line Y1-Y2 of FIG. 4.

FIG. 4 is a top view illustrating the structure of film layers of a photosensitive device according to an embodiment of the present disclosure, FIG. 5 is a cross-sectional view taken along the line X1-X2 of FIG. 4, and FIG. 6 is a cross-sectional view taken along the line Y1-Y2 of FIG. 4. Referring to FIG. 4, FIG. 5 and FIG. 6, a photosensitive transistor 100 includes a substrate 10 and a first semiconductor layer 20, a first gate 30, a first electrode 40, a second electrode 50 and a second semiconductor layer 60 which are located on a side of the substrate 10. The first semiconductor layer 20 includes a first doped region 21, a second doped region 22 and a channel region 23, where the channel region 23 is located between the first doped region 21 and the second doped region 22. The first electrode 40 is electrically connected to the first doped region 21, and the second electrode 50 is electrically connected to the second doped region 22. In a direction perpendicular onto the substrate 10, the first gate 30 is insulated from and overlaps the channel region 23. The second semiconductor layer 60 is in direct contact with the channel region 23. An area of the second semiconductor layer 60 is less than an area of the first semiconductor layer 20. Exemplarily, a vertical projection of the second semiconductor layer 60 onto the substrate 10 is located within a vertical projection of the first semiconductor layer 20 onto the substrate 10.

The photosensitive transistor 100 includes a main region A1 and opening regions A2, and the opening regions A2 are located at a periphery of the main region A1. The first electrode and the second electrode 50 are in the same layer and insulated from each other and both surround the main region A1. The opening regions A2 are formed between an end portion of the first electrode 40 and the second electrode 50 and between an end portion of the second electrode 50 and the first electrode 40. The second semiconductor layer 60 includes a main body portion 61 and auxiliary portions 62, where the main body portion 61 is located in the main region A1, and each of the auxiliary portions 62 are located in an opening region of the opening regions A2.

In an embodiment, the first semiconductor layer 20 and the second semiconductor layer 60 may each include amorphous silicon (referred to as a-Si for short). When the second semiconductor layer 60 receives light radiation, the a-Si in the second semiconductor layer 60 is excited, and electron migration is generated (that is, carriers are generated); since the second semiconductor layer 60 is in direct contact with the channel region 23 of the first semiconductor layer 20, the generated carriers can enter the channel region 23, causing the channel region 23 to generate positive charges; therefore, the conductivity of the channel region 23 is changed, that is, the threshold voltage of the photosensitive transistor 100 is shifted, so that the detection of the illumination can then be achieved through the detection on the amount of the shift of the threshold voltage. The first semiconductor layer 20 includes the first doped region 21, the second doped region 22 and the channel region 23. It may be set that the concentration of the conductive element doped in the first doped region 21 and the concentration of the conductive element doped in the second doped region 22 are greater than the concentration of the conductive element doped in the channel region 23, so that the conductivity of the first doped region 21 and the conductivity of the second doped region 22 are greater than the conductivity of the channel region 23. The first electrode 40 is electrically connected to the first doped region 21, and the second electrode 50 is electrically connected to the second doped region 22, so that the current generated in the channel region 23 can be transmitted to the first electrode 40 through the first doped region 21 having a relatively strong conductivity, or the current generated in the channel region 23 can be transmitted to the second electrode 50 through the second doped region 22 having a relatively strong conductivity. The photosensitive transistor 100 may include the main region A1 for disposing the main body portion 61 of the second semiconductor layer 60, and further include opening regions A2, which is disposed for insulation and spacing, between the end portion of the first electrode 40 and the second electrode 50 and between the end portion of the second electrode 50 and the first electrode 40. It may be set that the semiconductor layer 60 includes the auxiliary portions 62, and the auxiliary portions 62 are disposed in the opening regions A2, so that both the main region A1 of the photosensitive transistor 100 and the opening regions A2 of the photosensitive transistor 100 are provided in the second semiconductor layer 60, increasing the area of the second semiconductor layer 60 within a unit pixel size of the photosensitive transistor 100. On the one hand, a relatively large photocurrent can be generated under illumination, so that when the photosensitive transistor 100 is an n-type metal-oxide-semiconductor (NMOS) transistor, the threshold voltage of the photosensitive transistor 100 can be decreased; when the photosensitive transistor 100 is a p-type metal-oxide-semiconductor (PMOS), the threshold voltage of the photosensitive transistor 100 can be increased. Therefore, the sensitivity of photoelectric detection by the photosensitive transistor 100 can be effectively improved. On the other hand, it can be ensured that the channel structure of the main region A1 and the channel structure of the opening regions A2 remain uniform, that is, it can be ensured that the overall structure of the photosensitive transistor 100 is uniform, so that the stability of the device can be effectively improved.

Figure 7:
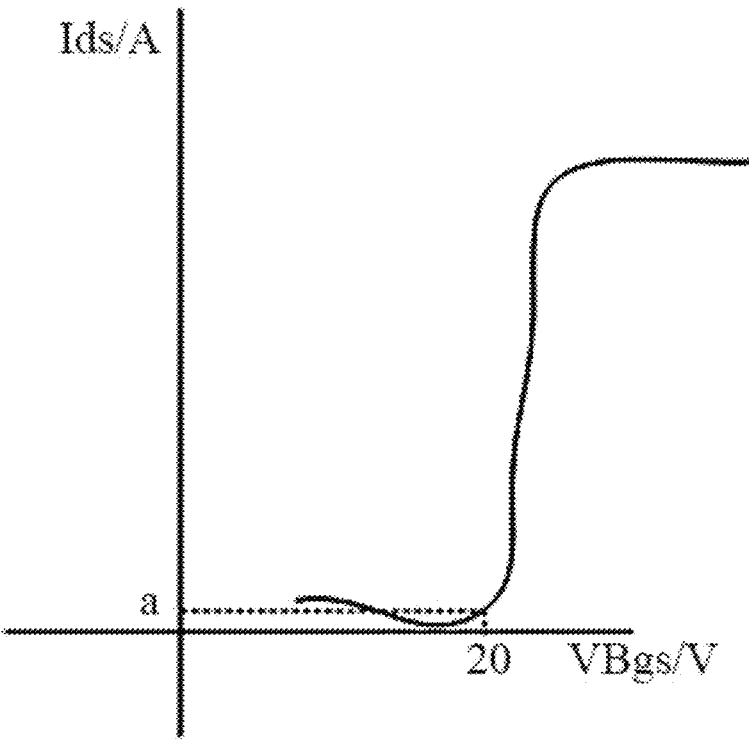
FIG. 7 is a curve illustrating dark state transfer characteristics of a photosensitive transistor according to an embodiment of the present disclosure.
Figure 8:
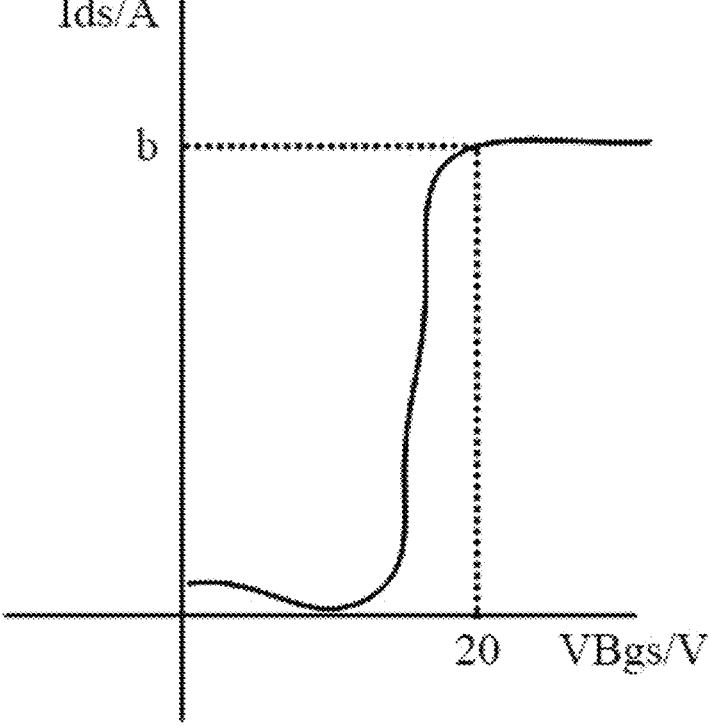
FIG. 8 is a curve illustrating bright state transfer characteristics of a photosensitive transistor according to an embodiment of the present disclosure.

FIG. 7 is a curve illustrating dark state transfer characteristics of a photosensitive transistor according to an embodiment of the present disclosure, and FIG. 8 is a curve illustrating bright state transfer characteristics of a photosensitive transistor according to an embodiment of the present disclosure. When the photosensitive transistor adopts the preceding structure, as shown in FIG. 7, when the gate-source voltage VBgs of the photosensitive transistor 100 is 20V, the current Ids flowing through the source of the photosensitive transistor 100 and the drain of the photosensitive transistor 100 satisfies that Ids=a, where the value of a is close to 10E-13; when there is light, the curve moves to the position shown in FIG. 8, and at this time, Ids=b, that is, compared with that Ids=a, Ids has a step increase, so that the photosensitivity of the photosensitive transistor 100 is effectively improved. The value of b is proportional to the illumination intensity.

Exemplarily, a gate insulating layer 70 is disposed between the first gate 30 and the first semiconductor layer 20 to achieve mutual insulation of the first gate 30 and the first semiconductor layer 20.

According to the photosensitive transistor provided in the embodiment of the present disclosure, the second semiconductor layer includes the main body portion disposed in the main region and the auxiliary portions disposed in the opening region between the end portion of the first electrode and the second electrode and in the opening region between the end portion of the second electrode and the first electrode. Therefore, on the one hand, a relatively large photocurrent is generated when light is received, so that a relatively large shift of the threshold voltage of the photosensitive transistor is generated, and the sensitivity of photoelectric detection by the photosensitive transistor can be effectively improved; on the other hand, it can be ensured that the channel structure of the main region and the channel structure of the opening regions remain uniform, that is, it can be ensured that the overall structure of the photosensitive transistor is uniform, so that the stability of the device can be effectively improved. In addition, the first semiconductor layer includes the first doped region and the second doped region which have a better conductivity, so that the current flowing in the channel region can be efficiently transmitted to the first electrode through the first doped region, or transmitted to the second electrode through the second doped region, and thus the current transmission efficiency of the photosensitive transistor can be effectively improved.

Optionally, referring to FIG. 4, FIG. 5 and FIG. 6, for vertical projections of the first electrode 40, the second electrode 50 and the second semiconductor layer 60 onto the substrate 10, a first gap a1 exists between the vertical projection of the first electrode 40 and the vertical projection of the second semiconductor layer 60, and a second gap a2 exists between the vertical projection of the second electrode 50 and the vertical projection of the second semiconductor layer 60.

In an embodiment, the first electrode 40 is electrically connected to the first doped region 21 of the first semiconductor layer 20 to form ohmic contact, and the second electrode 50 is electrically connected to the second doped region 22 of the first semiconductor layer 20 to form ohmic contact. Generally, the thickness of the second semiconductor layer 60 is greater than the thickness of the first electrode 40 and the thickness of the second electrode 50. For the vertical projections of the first electrode 40, the second electrode 50 and the second semiconductor layer 60 onto the substrate 10, if the vertical projection of the second semi-conductor layer 60 overlaps the vertical projection of the first electrode 40 and/or the vertical projection of the second electrode 50, carriers in the second semiconductor layer 60 are injected into the channel region 23 of the first semicon-ductor layer 20 through the first electrode and/or the second electrode 50 which is in contact with the second semicon-ductor layer 60, so that the flow path of carriers becomes longer in comparison with the manner that carriers in the second semiconductor layer 60 are directly injected into the channel region 23, resulting in the worse on-state current of the photosensitive transistor 100. Therefore, it is set that the first gap a1 exists between the vertical projection of the second semiconductor layer 60 and the vertical projection of the first electrode 40, and the second gap a2 exists between the vertical projection of the second semiconductor layer 60 and the vertical projection of the second electrode 50; in this manner, it can be ensured that the second semiconductor layer 60 is insulated from the first electrode 40 and the second electrode 50 and carriers in the second semiconduc-tor layer 60 are directly injected into the channel region 23, so that an excessively long flow path of carriers and exces-sive loss of the on-state current are avoided.

Optionally, with continued reference to FIG. 4, FIG. 5 and FIG. 6, for the vertical projections of the first electrode 40, the vertical projection of the second electrode 50 and the vertical projection of the second semiconductor layer 60 onto the substrate 10, a minimum distance between the vertical projection of the main body portion 61 and the vertical projection of the first electrode 40 is a first distance d1, a minimum distance between the vertical projection of an auxiliary portion 62 and the vertical projection of the first electrode 40 is a second distance d2, and the first distance d1 is equal to the second distance d2.

In an embodiment, to avoid the contact between the vertical projection of the second semiconductor layer 60 to the substrate base 10 and the vertical projection of the first electrode to the substrate base 10, it may be ensured that a minimum distance, that is, the first distance d1, exists between the vertical projection of the main body portion 61 of the second semiconductor layer 60 and the vertical projection of the first electrode 40 and that a minimum distance, that is, the second distance d2, exists between the vertical projection of an auxiliary portion 62 of the second semiconductor layer 60 and the vertical projection of the first electrode 40. It is to be understood that both the first distance d1 and the second distance d2 are greater than 0. In addition, the first distance d1 and the second distance d2 may be set to be equal, so that when the distance between the vertical projection of the main body portion 61 and the vertical projection of the first electrode 40 is the first distance d1 and the distance between the vertical projection of the auxiliary portion 62 and the vertical projection of the first electrode 40 is the second distance d2, it can be further ensured that the channel structure of the main region A1 and the channel structure of the opening regions A2 remain even and uniform, which is conducive to improving the stability of the device.

Optionally, with continued reference to FIG. 4, FIG. 5 and FIG. 6, for the vertical projections of the first electrode 40, the second electrode 50 and the second semiconductor layer 60 onto the substrate 10, a minimum distance between the vertical projection of the main body portion 61 and the vertical projection of the second electrode 50 is a third distance d3, a minimum distance between the vertical pro-jection of an auxiliary portion 62 and the vertical projection of the second electrode 50 is a fourth distance d4, and the third distance d3 is equal to the fourth distance d4.

In an embodiment, based on the same principle, to avoid the contact between the vertical projection of the second semiconductor layer 60 to the substrate base 10 and the vertical projection of the second electrode 50 to the substrate base 10, it may be ensured that a minimum distance, that is, the third distance d3, exists between the vertical projection of the main body portion 61 of the second semiconductor layer 60 and the vertical projection of the second electrode 50 and that a minimum distance, that is, the fourth distance d4, exists between the vertical projection of an auxiliary portion 62 of the second semiconductor layer 60 and the vertical projection of the second electrode 50. It is to be understood that both the third distance d3 and the fourth distance d4 are greater than 0. In addition, the third distance d3 and the fourth distance d4 may be set to be equal, so that when the distance between the vertical projection of the main body portion 61 and the vertical projection of the second electrode 50 is the third distance d3 and the distance between the vertical projection of the auxiliary portion 62 and the vertical projection of the second electrode 50 is the fourth distance d4, it can be further ensured that the channel structure of the main region A1 and the channel structure of the opening regions A2 remain even and uniform, which is conducive to improving the stability of the device.

Optionally, referring to FIG. 5 and FIG. 6, in the direction perpendicular onto the substrate 10, a thickness h1 of the main body portion 61 is equal to a thickness h2 of the auxiliary portions 62.

In an embodiment, the thickness h1 of the main body portion 61 and the thickness h2 of the auxiliary portions 62 are set to be equal, so that it can be ensured that the overall thickness of the second semiconductor layer 60 is uniform, thereby it is ensured that the channel structure of the main region A1 and the channel structure of the opening regions A2 remain even and uniform, and the stability of the device is further improved.

Optionally, referring to FIG. 4, a third gap a3 exists between the main body portion 61 and an auxiliary portion 62. The main body portion 61 and the auxiliary portion 62 are not directly connected, but are spaced apart by a certain distance.

In an embodiment, it may be set that the third gap a3 is the same as the second gap a2, that is, along the X1-X2 direction, the distance between the main body portion 61 and the auxiliary portion 62 is the same as the distance between the main body portion 61 and the second electrode 50; in this manner, it can be further ensured that the channel structure of the main region A1 and the channel structure of the opening regions A2 remain even and uniform, that is, it can be ensured that the device structure of the photosensitive transistor 100 is uniform, so that the stability of the device can be effectively improved.

Figure 9:
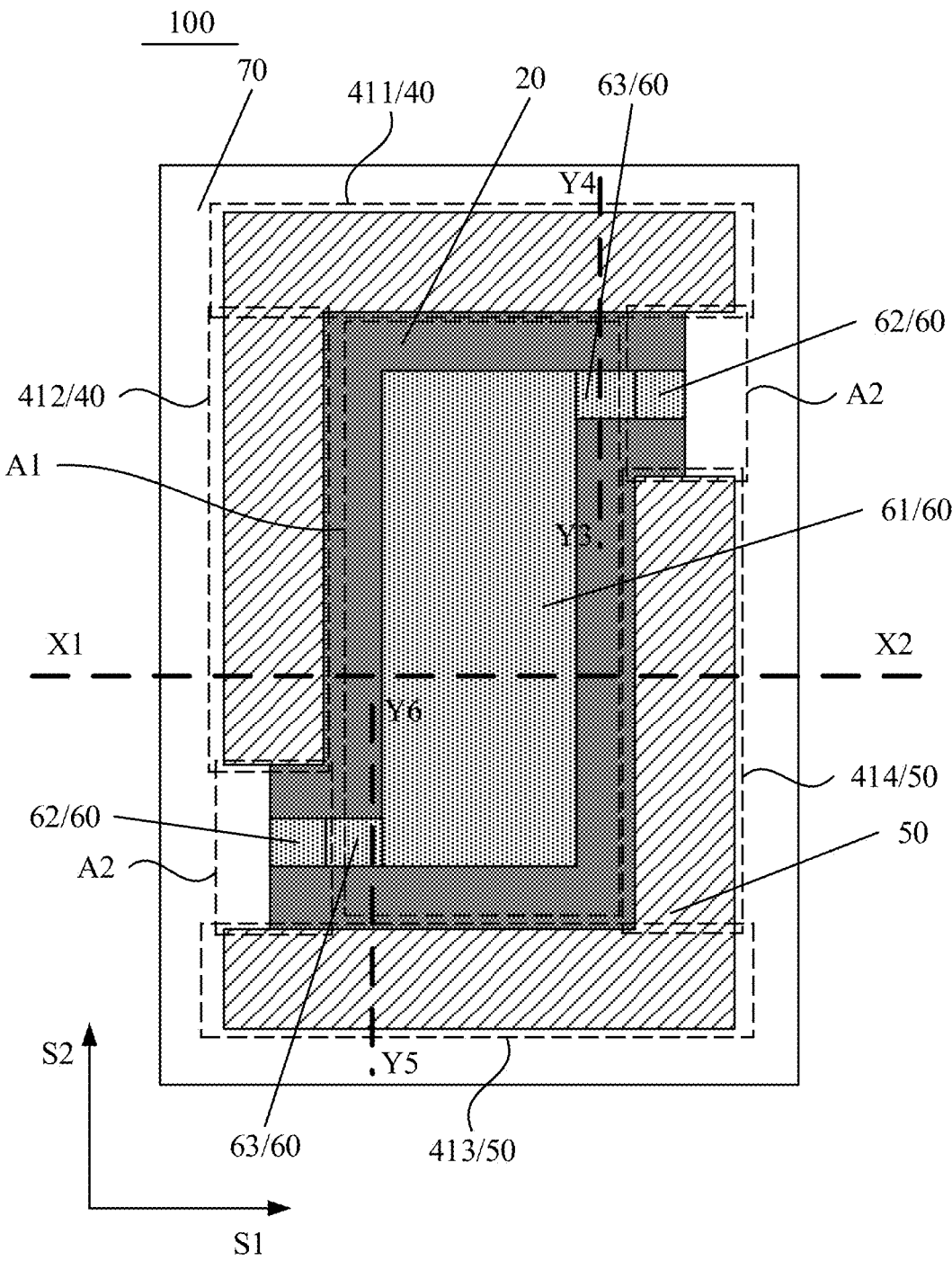
FIG. 9 is a top view illustrating the structure of film layers of another photosensitive transistor according to an embodiment of the present disclosure.
Figure 10:
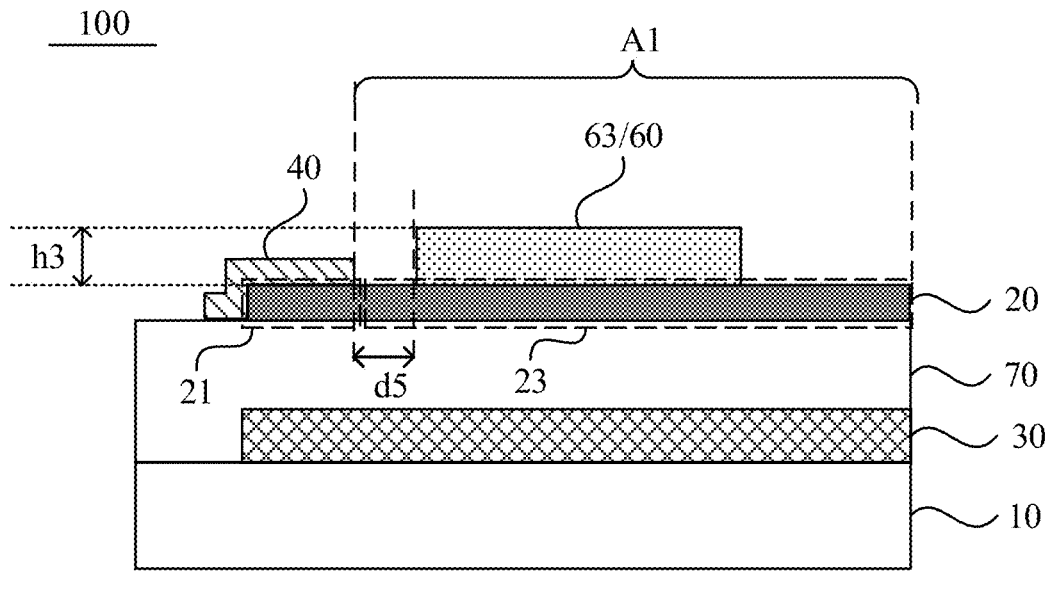
FIG. 10 is a cross-sectional view taken along the line Y3-Y4 of FIG. 9.
Figure 11:
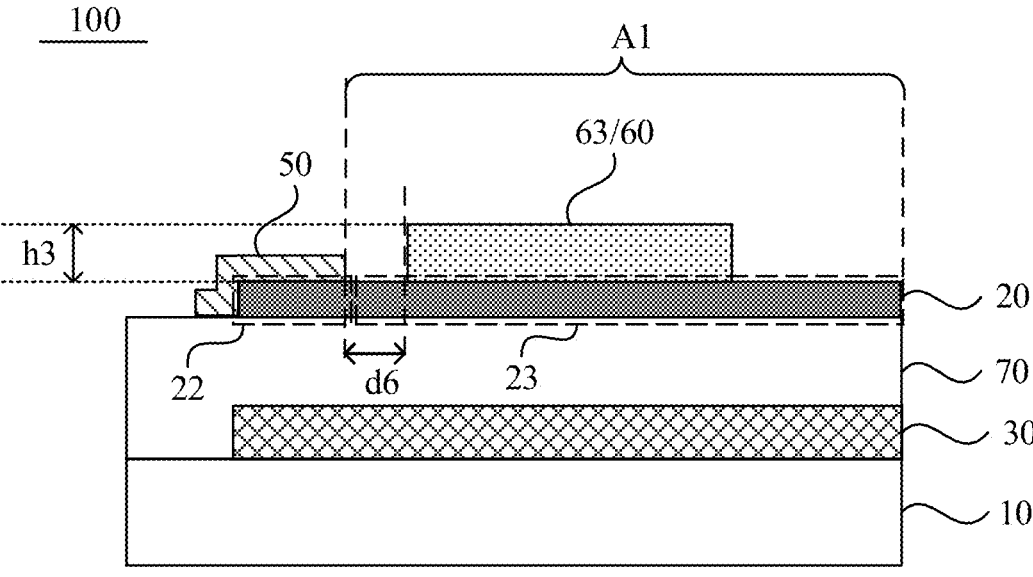
FIG. 11 is a cross-sectional view taken along the line Y5-Y6 of FIG. 9.

FIG. 9 is a top view illustrating the structure of film layers of another photosensitive transistor according to an embodi-ment of the present disclosure, FIG. 10 is a cross-sectional view taken along the line Y3-Y4 of FIG. 9, and FIG. 11 is a cross-sectional view taken along the line Y5-Y6 of FIG. 9. Referring to FIG. 9, FIG. 10 and FIG. 11, the second semiconductor layer 60 further includes connection portions 63, and a connection portion 63 connects the main body portion 61 and an auxiliary portion 62. The main body portion 61, the auxiliary portions 62 and the connection portions 63 may be different portions in the same semiconductor material layer.

In an embodiment, the main body portion 61 of the second semiconductor layer 60 and the auxiliary portions 62 of the second semiconductor layer 60 may be set as an integral structure, that is, the main body portion 61 is connected to the auxiliary portions 62 through the connection portions 63, so that the area of the second semiconductor layer 60 can be increased. In this manner, on the one hand, a relatively large photocurrent can be generated under illumination, and the sensitivity of photoelectric detection by the photosensitive transistor 100 can be effectively improved. On the other hand, the second semiconductor layer 60 is disposed along the extension path of the first electrode 40 and/or the extension path of the second electrode 50, so that it is ensured that the channel structure of the main region A1 and the channel structure of the opening regions A2 remain even and uniform, and the stability of the device can be further improved.

Optionally, referring to FIG. 5, FIG. 9, FIG. 10 and FIG. 11, for vertical projections of the first electrode 40 and the second semiconductor layer 60 onto the substrate 10, a minimum distance between the vertical projection of the main body portion 61 and the vertical projection of the first electrode 40 is a first distance d1, a minimum distance between the vertical projection of a connection portion 63 and the vertical projection of the first electrode 40 is a fifth distance d5, and the first distance d1 is equal to the fifth distance d5.

In an embodiment, for the vertical projection onto the substrate 10, a minimum distance, that is, the first distance d1, is set between the vertical projection of the main body portion 61 of the second semiconductor layer 60 and the vertical projection of the first electrode 40, and a minimum distance, that is, the fifth distance d5, is set between the vertical projection of a connection portion 63 of the second semiconductor layer 60 and the vertical projection of the first electrode 40, so that the contact between the vertical projection of the second semiconductor layer 60 onto the substrate 10 and the vertical projection of the first electrode 40 onto the substrate 10 can be avoided, and an excessively long flow path of carriers and excessive loss of the on-state current are avoided. It is to be understood that both the first distance d1 and the fifth distance d5 are greater than 0. In addition, the first distance d1 and the fifth distance d5 may be set to be equal, so that when the distance between the vertical projection of the main body portion 61 and the vertical projection of the first electrode 40 is the first distance d1, the distance between the vertical projection of the auxiliary portion 62 and the vertical projection of the first electrode 40 is the second distance d2, and the distance between the vertical projection of the connection portion 63 and the vertical projection of the first electrode 40 is the fifth distance d5, it can be further ensured that the channel structure of the main region A1 and the channel structure of the opening regions A2 remain even and uniform, which is conducive to improving the stability of the device and simplifying the preparation process of the second semiconductor layer 60.

Optionally, with continued reference to FIG. 5, FIG. 9, FIG. 10 and FIG. 11, for vertical projections of the second electrode 50 and the second semiconductor layer 60 onto the substrate 10, a minimum distance between the vertical projection of the main body portion 61 and the vertical projection of the second electrode 50 is a third distance d3, a minimum distance between the vertical projection of a connection portion 63 and the vertical projection of the second electrode 50 is a sixth distance d6, and the third distance d3 is equal to the sixth distance d6.

In an embodiment, based on the same principle, for the vertical projections onto the substrate 10, a minimum distance, that is, the third distance d3, is set between the vertical projection of the main body portion 61 of the second semiconductor layer 60 and the vertical projection of the second electrode 50, and a minimum distance, that is, the sixth distance d6, is set between the vertical projection of the connection portion 63 of the second semiconductor layer 60 and the vertical projection of the second electrode 50, so that the contact between the vertical projection of the second semiconductor layer 60 onto the substrate 10 and the vertical projection of the second electrode 50 onto the substrate 10 can be avoided, and an excessively long flow path of carriers and excessive loss of the on-state current are avoided. It is to be understood that both the third distance d3 and the sixth distance d6 are greater than 0. In addition, the third distance d3 and the sixth distance d6 may be set to be equal, so that when the distance between the vertical projection of the main body portion 61 and the vertical projection of the second electrode 50 is the third distance d3, the distance between the vertical projection of the auxiliary portion 62 and the vertical projection of the second electrode 50 is the fourth distance d4, and the distance between the vertical projection of the connection portion 63 and the vertical projection of the second electrode 50 is the sixth distance d6, it can be further ensured that the channel structure of the main region A1 and the channel structure of the opening regions A2 remain even and uniform, which is conducive to improving the stability of the device and simplifying the preparation process of the second semiconductor layer 60.

Optionally, referring to FIG. 9, FIG. 10 and FIG. 11, in the direction perpendicular onto the substrate 10, a thickness h1 of the main body portion 61 is equal to a thickness h3 of the connection portions 63.

In an embodiment, the thickness h1 of the main body portion and the thickness h3 of the connection portions 63 are set to be equal, so that it can be ensured that the overall thickness of the second semiconductor layer 60 is uniform; on this basis, the thick ness h1 of the main body portion, the thickness h2 of the auxiliary portions 62 and the thickness h3 of the connection portions 63 may be set to be equal, so that it is ensured that the channel structure of the main region A1 and the channel structure of the opening regions A2 remain even and uniform, and the stability of the device is further improved while the sensitivity of photoelectric detection by the photosensitive transistor 100 is improved.

Optionally, a thickness of the main body portion 61 is greater than or equal to 4000 nm and is less than or equal to 12000 nm. In this manner, it can be ensured that the second semiconductor layer 60 has a relatively large thickness and that the second semiconductor layer 60 has relatively high photosensitive efficiency. Further, the thickness of the main body portion 61 is greater than or equal to 5000 nm and is less than or equal to 8000 nm; in this manner, the overall thickness of the photosensitive transistor 100 can be reduced while it is ensured that the second semiconductor layer 60 has relatively high photosensitive efficiency, which facilitates a light and thin design of the photosensitive transistor 100.

Optionally, referring to FIG. 4 or FIG. 9, the first electrode 40 includes a first sub-electrode 411 and a second sub-electrode 412 which are connected to each other, and the second electrode 50 includes a third sub-electrode 413 and a fourth sub-electrode 414 which are connected to each other. The first sub-electrode 411 and the third sub-electrode 413 both extend along a first direction S1, the second sub-electrode 412 and the fourth sub-electrode 414 both extend along a second direction S2, and the first direction S1 intersects the second direction S2. In an embodiment, the first direction S1 is perpendicular to the second direction S2. In another embodiment, the first direction S1 and the second direction S2 are not perpendicular to each other and have an included angle greater than 0° and less than 90°. The second sub-electrode 412 and the fourth sub-electrode 414 are arranged along the first direction S1. The first sub-electrode 411 and the third sub-electrode 413 are arranged along the second direction S2. Along the second direction S2, a region between an end portion of the fourth sub-electrode 414 and an end portion of the first sub-electrode 411 forms an opening region A2, and a region between an end portion of the second sub-electrode 412 and an end portion of the third sub-electrode 413 forms an opening region A2.

In an embodiment, the first direction S1 and the second direction S2 may be perpendicular to each other; through the preceding arrangement, the first electrode 40 and the second electrode 50 may be "L" type electrodes. Along the second direction S2, a region between an end portion of the fourth sub-electrode 414 and an end portion of the first sub-electrode 41 forms an opening region A2, and a region between an end portion of the second sub-electrode 42 and an end portion of the third sub-electrode 51 forms an opening region A2. The two "L" type electrodes are disposed opposite on the edge region of the first semiconductor layer 20 and thus can form a rectangular outline surrounding the main region A1. In this manner, the arrangement of the first electrode 40, the second electrode 50 and the second semiconductor layer 60 can be relatively simple, which is conducive to facilitate the preparation process.

Figure 12:
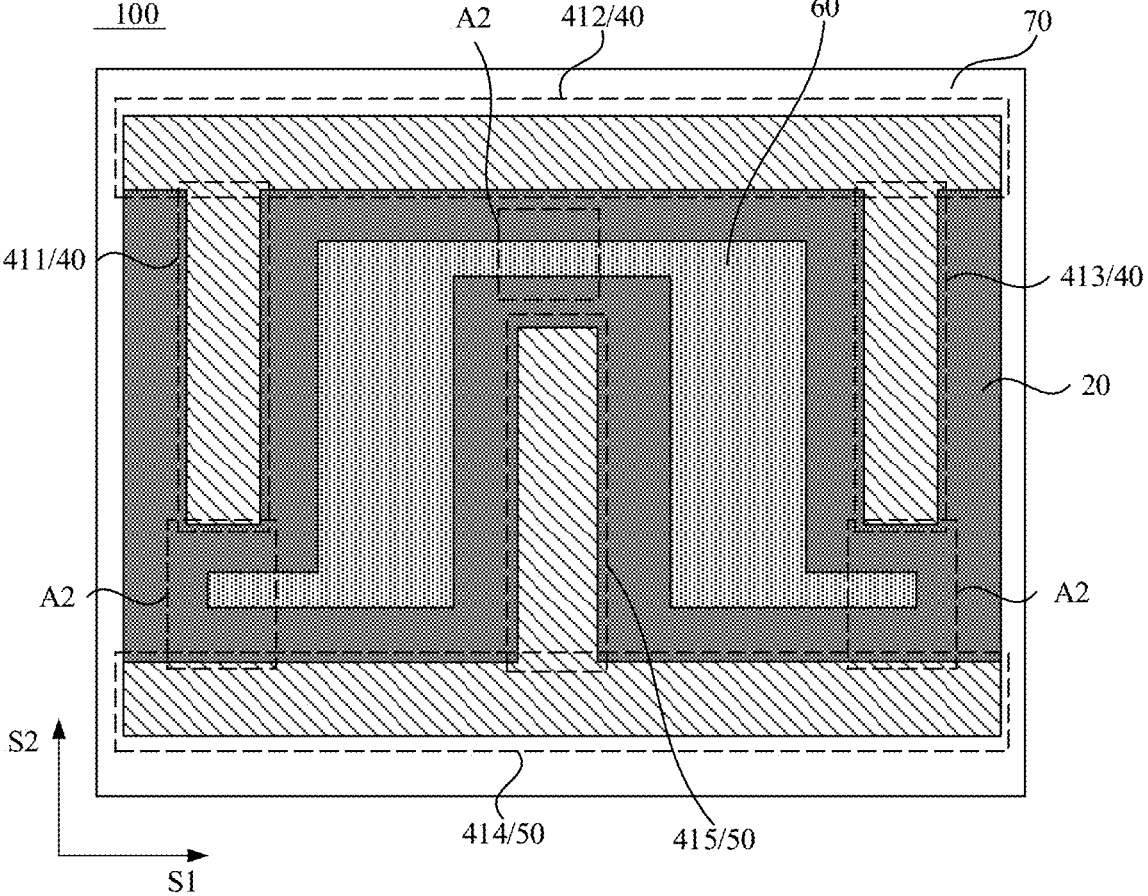
FIG. 12 is a top view illustrating the structure of film layers of another photosensitive transistor according to an embodiment of the present disclosure.

Optionally, the first electrode 40 and the second electrode 50 may be set to form a tine-shaped electrode. FIG. 12 is a top view illustrating the structure of film layers of another photosensitive transistor according to an embodiment of the present disclosure. Referring to FIG. 12, the first electrode 40 includes a first sub-electrode 411, a second sub-electrode 412 and a third sub-electrode 413, an end of the first sub-electrode 411 is connected to the second sub-electrode 412, and an end of the third sub-electrode 413 is connected to the second sub-electrode 412. The second electrode 50 includes a fourth sub-electrode 414 and a fifth sub-electrode 415, and an end of the fifth sub-electrode 415 is connected to the fourth sub-electrode 414. The second sub-electrode 412 and the fourth sub-electrode 414 both extend along a first direction S1, the first sub-electrode 411, the third sub-electrode 413 and the fifth sub-electrode 415 all extend along a second direction S2, and the first direction S1 intersects the second direction S2 (the first direction S1 and the second direction S2 may be perpendicular to each other). Along the first direction S1, the fifth sub-electrode 415 is located between the first sub-electrode 411 and the third sub-electrode 413. The second sub-electrode 412 and the fourth sub-electrode 414 are arranged along the second direction S2. Along the second direction S2, a region between an end portion of the first sub-electrode 411 and an end portion of the fourth sub-electrode 414 forms an opening region A2, a region between an end portion of the fifth sub-electrode 415 and the second sub-electrode 412 forms an opening region A2, and a region between an end portion of the third sub-electrode 413 and the fourth sub-electrode 414 forms an opening region A2.

Figure 13:
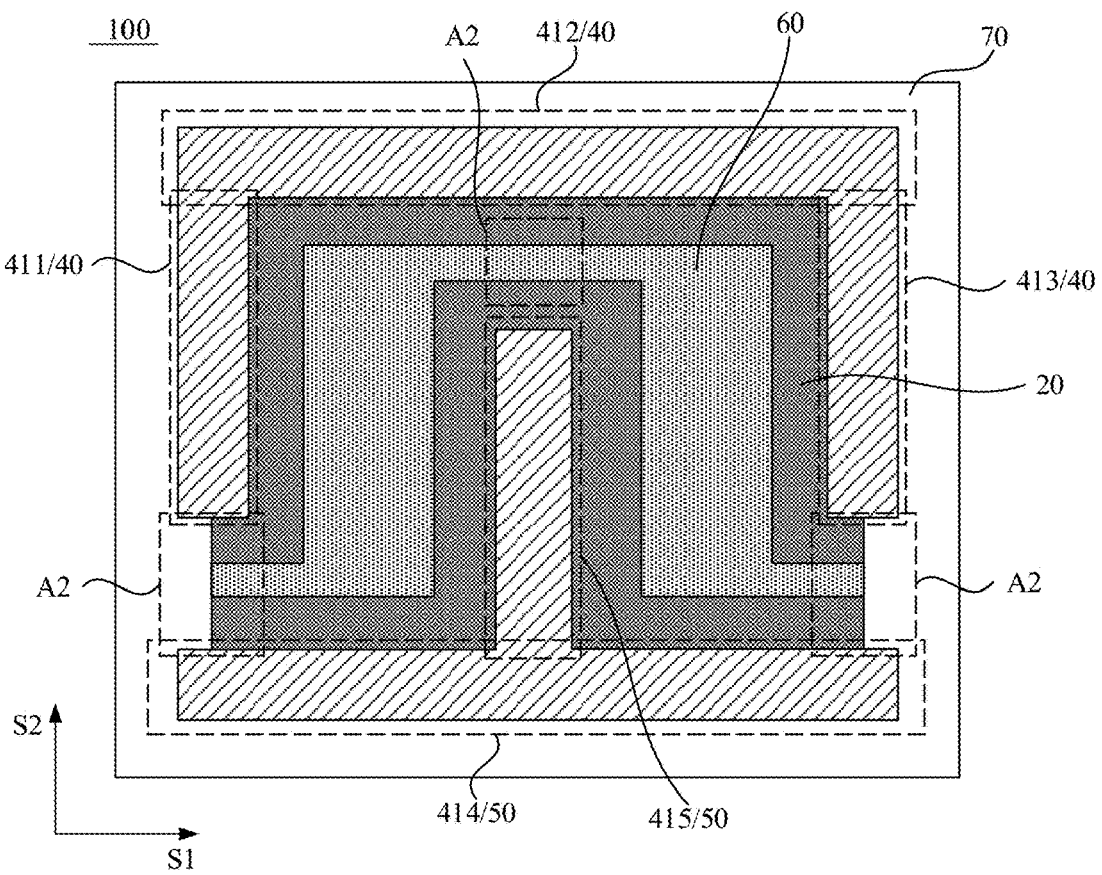
FIG. 13 is a top view illustrating the structure of film layers of another photosensitive transistor according to an embodiment of the present disclosure.

Optionally, the shape of the tine of the tine-shaped electrode may be set according to design requirements. FIG. 13 is a top view illustrating the structure of film layers of another photosensitive transistor according to an embodiment of the present disclosure. Referring to FIG. 13, it may further be set that an end of the second sub-electrode 412 is connected to the first sub-electrode 411, and the other end of the second sub-electrode 412 is connected to the third sub-electrode 413. The first sub-electrode 411, the second sub-electrode 412 and the third sub-electrode 413 form a tine-shaped electrode.

Figure 14:
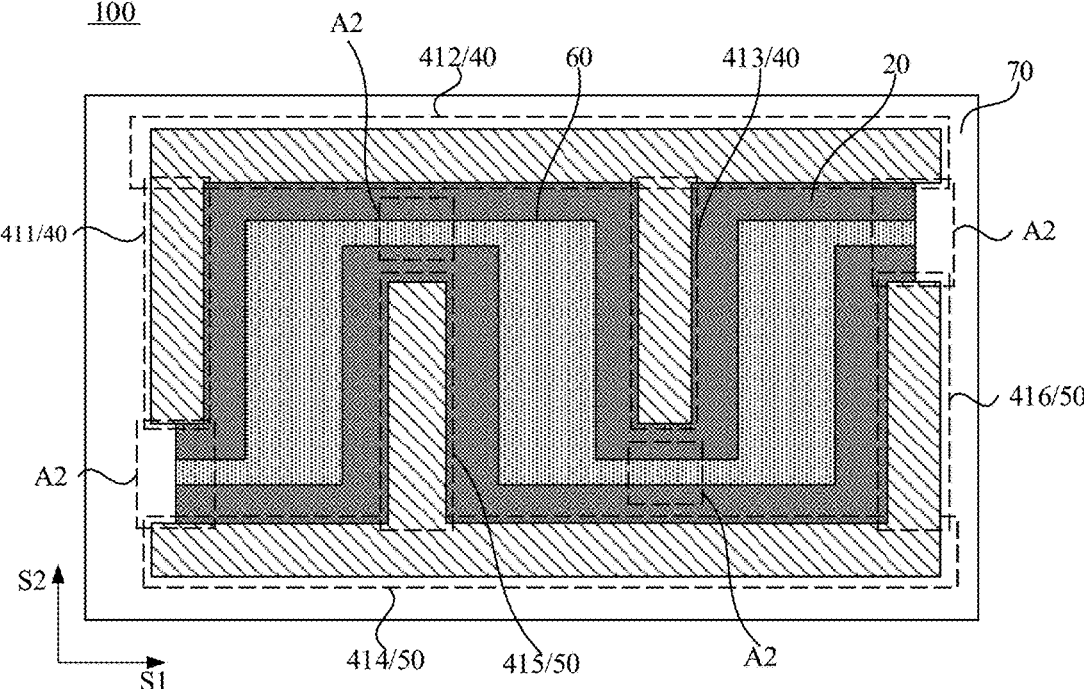
FIG. 14 is a top view illustrating the structure of film layers of another photosensitive transistor according to an embodiment of the present disclosure.

Optionally, when the first electrode 40 and the second electrode 50 form a tine-shaped electrode, the number of tines of the tine-shaped electrode may be set according to design requirements. FIG. 14 is a top view illustrating the structure of film layers of another photosensitive transistor according to an embodiment of the present disclosure. Referring to FIG. 14, the second electrode 50 further includes a sixth sub-electrode 416, and an end of the fourth sub-electrode 414 is connected to an end of the sixth sub-electrode 416. The sixth sub-electrode 416 extends along the second direction S2. Along the first direction S1, the fifth sub-electrode 415 is located between the first sub-electrode 411 and the third sub-electrode 413; and the third sub-electrode 413 is located between the sixth sub-electrode 416 and the fifth sub-electrode 415. Along the second direction S2, a region between an end portion of the sixth sub-electrode 416 and an end portion of the second sub-electrode 412 forms an opening region A2.

Figure 15:
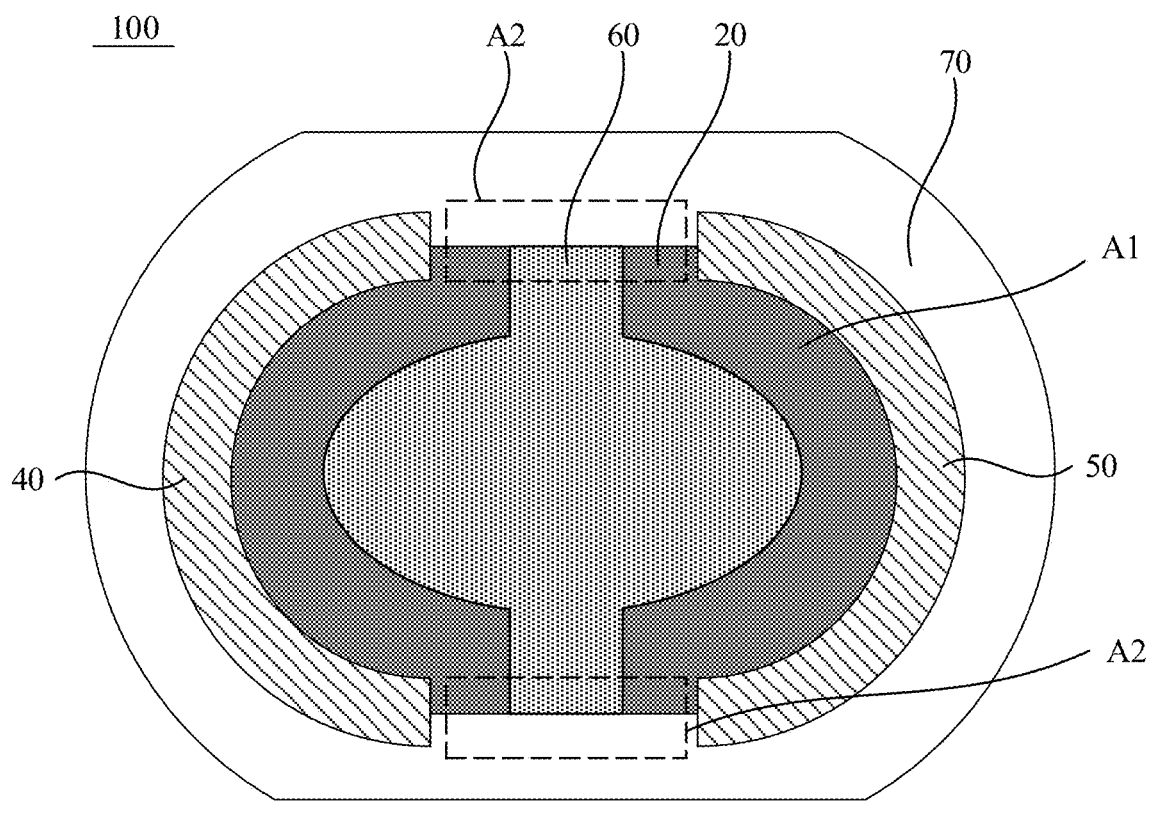
FIG. 15 is a top view illustrating the structure of film layers of another photosensitive transistor according to an embodiment of the present disclosure.

Optionally, FIG. 15 is a top view illustrating the structure of film layers of another photosensitive transistor according to an embodiment of the present disclosure. Referring to FIG. 15, the first electrode 40 and the second electrode 50 are each in an arc shape. A region between an end portion of the first electrode 40 and an end portion of the second electrode 50 forms an opening region A2. The first electrode 40, the second electrode 50 and the opening regions A2, as a circle, surround the main region A1.

Exemplarily, referring to FIG. 15, the first electrode 40 and the second electrode 50 are each in a circular shape or an elliptical shape. In other embodiments, the first electrode 40 and the second electrode 50 may also be in other arc shapes, such as a hyperbolic shape, a parabolic shape, etc.

Figure 16:
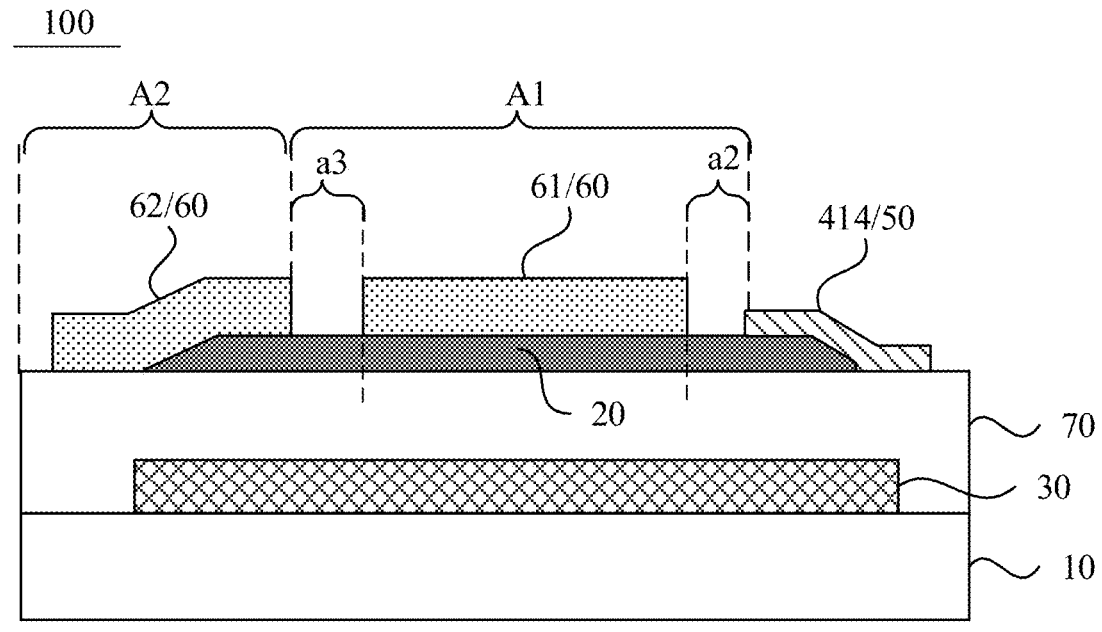
FIG. 16 is a cross-sectional view of another photosensitive transistor according to an embodiment of the present disclosure.

Optionally, FIG. 16 is a cross-sectional view of another photosensitive transistor according to an embodiment of the present disclosure. Referring to FIG. 4 and FIG. 16, for vertical projections of the first semiconductor layer 20 and the second semiconductor layer 60 onto the substrate, the vertical projection of an edge of the first semiconductor layer 20 is located between the vertical projection of an edge of an auxiliary portion 62 and the vertical projection of the main body portion 61. That is, the vertical projection of the auxiliary portion 62 extends beyond the vertical projection of the edge of the first semiconductor layer 20, so that the area of the vertical projection of the auxiliary portion 62 is increased, the photosensitive area is increased, and the sensitivity of photoelectric detection by the photosensitive transistor 100 can be effectively improved.

Optionally, referring to FIG. 5 and FIG. 6, the first electrode 40, the second electrode 50 and the second semiconductor layer 60 are located on the same side of the first semiconductor layer 20.

In an embodiment, the first electrode 40, the second electrode 50 and the second semiconductor layer 60 are disposed on the side of the first semiconductor layer 20 away from the substrate 10. The side of the second semiconductor layer 60 away from the first semiconductor layer 20 is a light receiving surface. Under illumination, photogenerated carriers generated by the second semiconductor layer 60 enter the channel region 23 of the first semiconductor layer 20, so that the threshold voltage of the photosensitive transistor 100 is changed.

Figure 17:
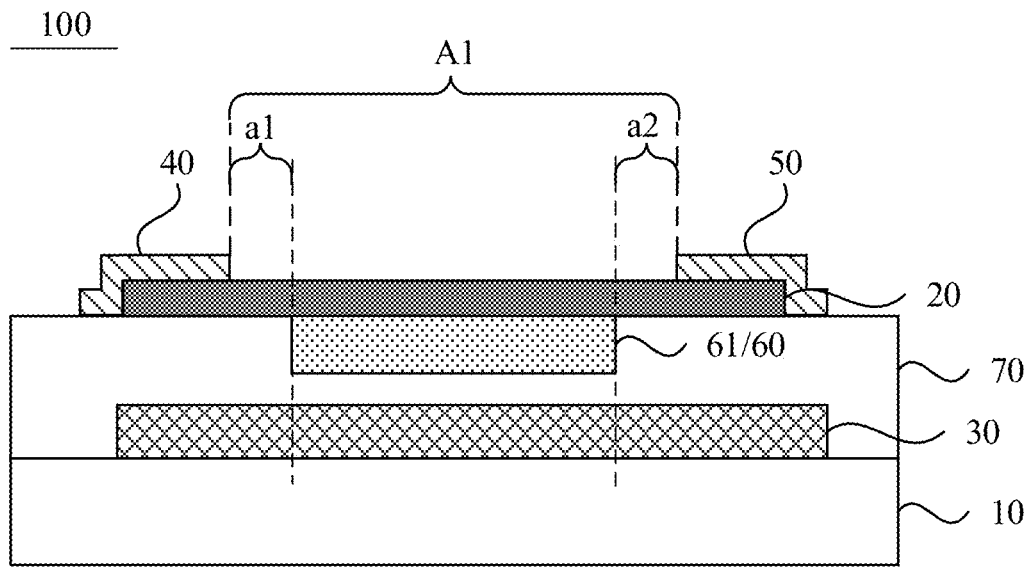
FIG. 17 is another cross-sectional view taken along the line X1-X2 of FIG. 4.

Optionally, FIG. 17 is another cross-sectional view taken along the line X1-X2 of FIG. 4. Referring to FIG. 17, the first electrode 40 and the second electrode 50 are located on the same side of the first semiconductor layer 20. The first semiconductor layer 20 is located between the first electrode 40 and the second semiconductor layer 60. The side of the first semiconductor layer 20 away from the second semiconductor layer 60 is a light receiving surface. Under illumination, photogenerated carriers generated by the second semiconductor layer 60 enter the channel region 23 of the first semiconductor layer 20, so that the threshold voltage of the photosensitive transistor 100 is changed.

In an embodiment, the first electrode 40 and the second electrode 50 are disposed on the side of the first semiconductor layer 20 away from the substrate 10, and the second semiconductor layer 60 is disposed on the side of the first semiconductor layer 20 close to the substrate 10.

Exemplarily, referring to FIG. 17, the first gate 30 may be located on the side of the first semiconductor layer 20 away from the first electrode 40 and the second electrode 50. The first gate 30 may be disposed on the substrate 10, and the gate insulating layer 70 is disposed between the first gate 30 and the second semiconductor layer 60.

Figure 18:
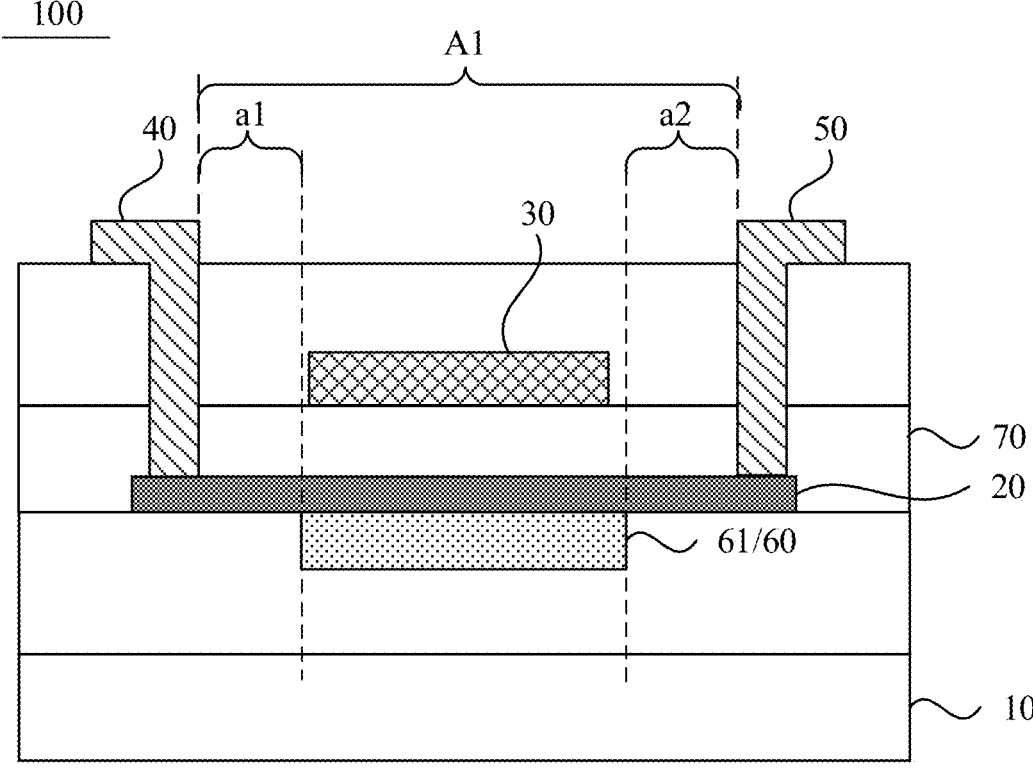
FIG. 18 is another cross-sectional view taken along the line X1-X2 of FIG. 4.

Optionally, FIG. 18 is another cross-sectional view taken along the line X1-X2 of FIG. 4. Referring to FIG. 18, the first gate 30, the first electrode 40 and the second electrode 50 are located on the same side of the first semiconductor layer 20.

In an embodiment, the first gate 30, the first electrode 40 and the second electrode 50 are all set on the side of the first semiconductor layer 20 away from the substrate 10. If the second semiconductor layer 60 is located on the side of the first semiconductor layer 20 close to the substrate 10, the gate insulating layer 70 is disposed between the first gate 30 and the first semiconductor layer 20. The first gate 30 is disposed insulated from both the first electrode 40 and the second electrode 50. The side of the second semiconductor layer 60 away from the first semiconductor layer 20 is a light receiving surface, that is, the side of the second semiconductor layer 60 on which the substrate 10 is disposed is a light receiving surface.

Optionally, the first semiconductor layer 20 and the second semiconductor layer 60 have the same material. Thus, the first semiconductor layer 20 and the second semiconductor layer 60 are integrally formed and then separately patterned, so that the preparation process is simplified.

Exemplarily, the first semiconductor layer 20 includes one of monocrystalline silicon, polycrystalline silicon, amorphous silicon or a metal oxide.

Based on the same inventive concept, an embodiment of the present disclosure further provides a method for manufacturing a photosensitive transistor. The method is used for manufacturing the photosensitive transistor provided in any embodiment of the present disclosure. FIG. 19 is a flowchart of a method for manufacturing a photosensitive transistor according to an embodiment of the present disclosure. Referring to FIG. 19, the method for manufacturing a photosensitive transistor includes steps described below.

In S110, a first gate is formed.

In S120, a gate insulating layer is formed.

In S130, a first semiconductor layer and a second semiconductor layer are formed. An area of the second semiconductor layer is less than an area of the first semiconductor layer.

In S140, doping is performed on part of the first semiconductor layer which is not covered by the second semiconductor layer so that a first doped region, a channel region and a second doped region are formed. The channel region is located between the first doped region and the second doped region.

In S150, a first electrode electrically connected to the first doped region and a second electrode electrically connected to the second doped region are formed.

Figure 20:
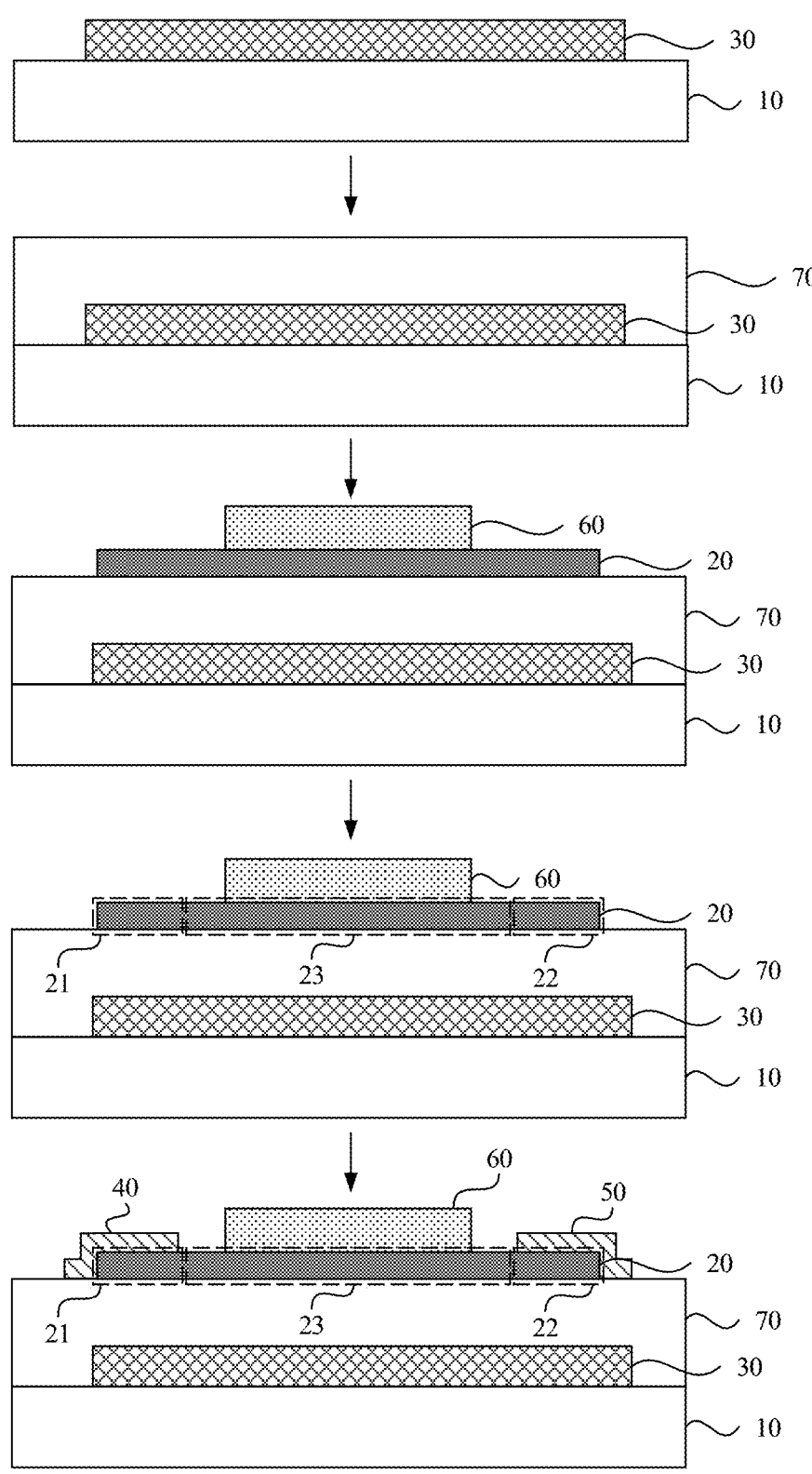
FIG. 20 is a view illustrating a process of manufacturing a photosensitive transistor according to an embodiment of the present disclosure.

In an embodiment, FIG. 20 is a view illustrating a process of manufacturing a photosensitive transistor according to an embodiment of the present disclosure. Referring to FIG. 20, the substrate 10 may first be provided, the first gate 30 is formed on the substrate 10, and the gate insulating layer 70 is formed on the side of the first gate 30 away from the substrate 10. The first semiconductor layer 20 and the second semiconductor layer 60 are then formed on the gate insulating layer 70. The area of the second semiconductor layer 60 is set to be less than the area of the first semiconductor layer 20. Part of the first semiconductor layer 20 which is not in contact with the second semiconductor layer 60 is doped to form the first doped region 21 and the second doped region 22, so that the conductivity of the first doped region 21 and the conductivity of the second doped region 22 are better than the conductivity of the channel region 23. The channel region 23 is located between the first doped region 21 and the second doped region 22, the first electrode 40 is formed on the first doped region 21, the second electrode 50 is formed on the second doped region 22, and the first electrode 40 and the second electrode 50 serve as a source of the photosensitive transistor and a drain of the photosensitive transistor, respectively.

According to the method for manufacturing a photosensitive transistor provided in the embodiment of the present disclosure, the second semiconductor layer is disposed both in a main region surrounded by the first electrode and the second electrode and in opening regions, at a periphery of the main region, formed between the first electrode and the second electrode. Therefore, on the one hand, a relatively large photocurrent is generated when light is received, so that a relatively large shift of the threshold voltage of the photosensitive transistor is generated, and the sensitivity of photoelectric detection by the photosensitive transistor can be effectively improved; on the other hand, it can be ensured that the channel structure of the main region and the channel structure of the opening regions remain uniform, that is, it can be ensured that the overall structure of the photosensitive transistor is uniform, so that the stability of the device can be effectively improved. In addition, the first semiconductor layer is doped so that the first doped region and the second doped region which have a better conductivity are formed, so that the current flowing in the channel region can be efficiently transmitted to the first electrode through the first doped region, or transmitted to the second electrode through the second doped region, and thus the current transmission efficiency of the photosensitive transistor can be effectively improved.

Optionally, FIG. 21 is a flowchart of another method for manufacturing a photosensitive transistor according to an embodiment of the present disclosure. Referring to FIG. 21, the method for manufacturing the photosensitive transistor includes steps described below.

In S210, a first gate is formed.

In S220, a gate insulating layer is formed.

In S230, an original semiconductor layer is formed by a film-forming process.

In S240, the original semiconductor layer is etched to the gate insulating layer so that a patterned semiconductor layer is formed.

In S250, part of the patterned semiconductor layer in a thickness direction in a region other than a main region and other than opening regions is etched so that a first semiconductor layer and a second semiconductor layer are formed.

Figure 22:
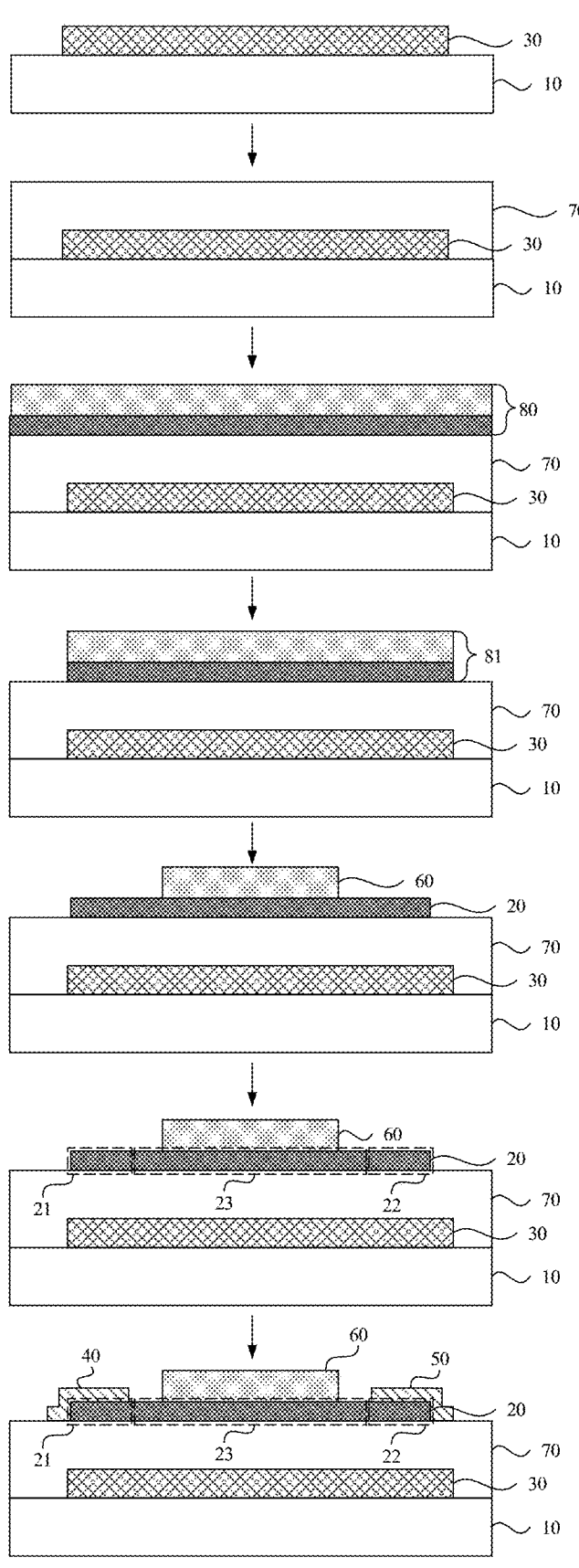
FIG. 22 is a view illustrating another process of manufacturing a photosensitive transistor according to an embodiment of the present disclosure.

In an embodiment, the material of the first semiconductor layer may be the same as the material of the second semiconductor layer, and in this case, the first semiconductor layer and the second semiconductor layer may be integrally formed first and then patterned to simplify the manufacturing process. FIG. 22 is a view illustrating another process of manufacturing a photosensitive transistor according to an embodiment of the present disclosure. Referring to FIG. 22, the original semiconductor layer 80 (to facilitate the differentiation between the first semiconductor layer 20 and the second semiconductor layer 60 finally formed by the original semiconductor layer 80, the original semiconductor layer 80 is represented as two film layers; in practice, the original semiconductor layer 80 is one film layer) may be formed first by a film-forming process. Then, the original semiconductor layer 80 is patterned for the first time so that a patterned semiconductor layer 81 is formed, that is, the original semiconductor layer 80 is etched to the gate insulating layer 70, and the patterned semiconductor layer 81 having the main region A1 and the opening regions A2 is retained. The patterned semiconductor layer 81 is patterned for the second time, and part of the patterned semiconductor layer 81 in the thickness direction is etched in the region other than the main region A1 and the opening regions A2 so that the first semiconductor layer 20 and the second semiconductor layer 60 which have different areas are formed.

In S260, doping is performed on part of the first semiconductor layer which is not covered by the second semiconductor layer so that a first doped region, a channel region and a second doped region are formed. The channel region is located between the first doped region and the second doped region.

In S270, a first electrode electrically connected to the first doped region and a second electrode electrically connected to the second doped region are formed.

An embodiment of the present disclosure further provides a photoelectric detector. The photoelectric detector includes the photosensitive transistor provided in any embodiment of the present disclosure, so that the photoelectric detector provided in the embodiment of the present disclosure includes the technical features of the photosensitive transistor provided in any embodiment of the present disclosure and can achieve the beneficial effects of the photosensitive transistor provided in any embodiment of the present disclosure. For the similarities, reference may be made to the preceding description of the photosensitive transistor provided in the embodiments of the present disclosure, which is not repeated here.

The photoelectric detector may be an independent photoelectric detector device, may be integrated into a display panel, or may be integrated with a display panel as a plug-in.

Figure 23:
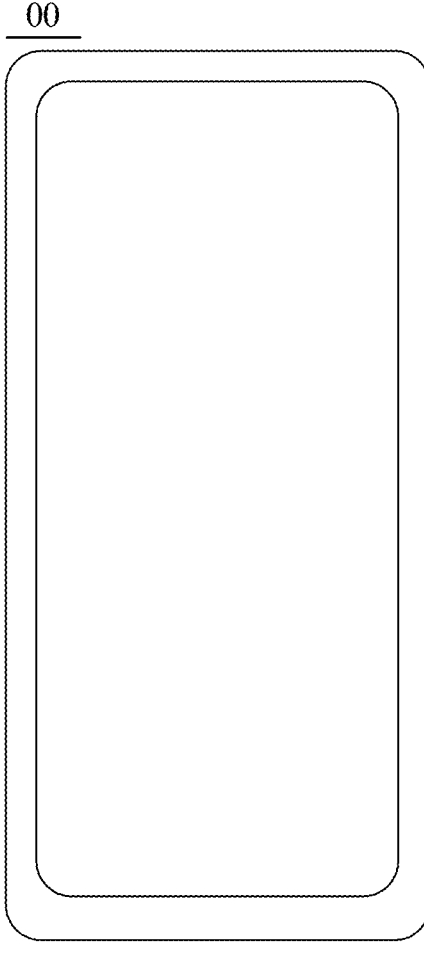
FIG. 23 is a view illustrating the structure of a display according to an embodiment of the present disclosure.

An embodiment of the present disclosure further provides a display. The display includes the photosensitive transistor provided in any embodiment of the present disclosure, so that the display provided in the embodiment of the present disclosure includes the technical features of the photosensitive transistor provided in any embodiment of the present disclosure and can achieve the beneficial effects of the photosensitive transistor provided in any embodiment of the present disclosure. For the similarities, reference may be made to the preceding description of the photosensitive transistor provided in the embodiments of the present disclosure, which is not repeated here. In an embodiment, FIG. 23 is a view illustrating the structure of a display according to an embodiment of the present disclosure. Referring to FIG. 23, the display 00 may be a display panel such as an organic light-emitting display panel, a liquid crystal display panel, an electrophoretic display panel or a micro light-emitting diode display panel.

A display apparatus including the display may be any electronic product with a display function, including but not limited to the following categories: a virtual reality (VR) display, a television, a laptop computer, a desktop display, a tablet computer, a digital camera, a mobile phone, a smart bracelet, smart glasses, an in-vehicle display, medical equipment, industrial control equipment, a touch interactive terminal, etc.

Figure 24:
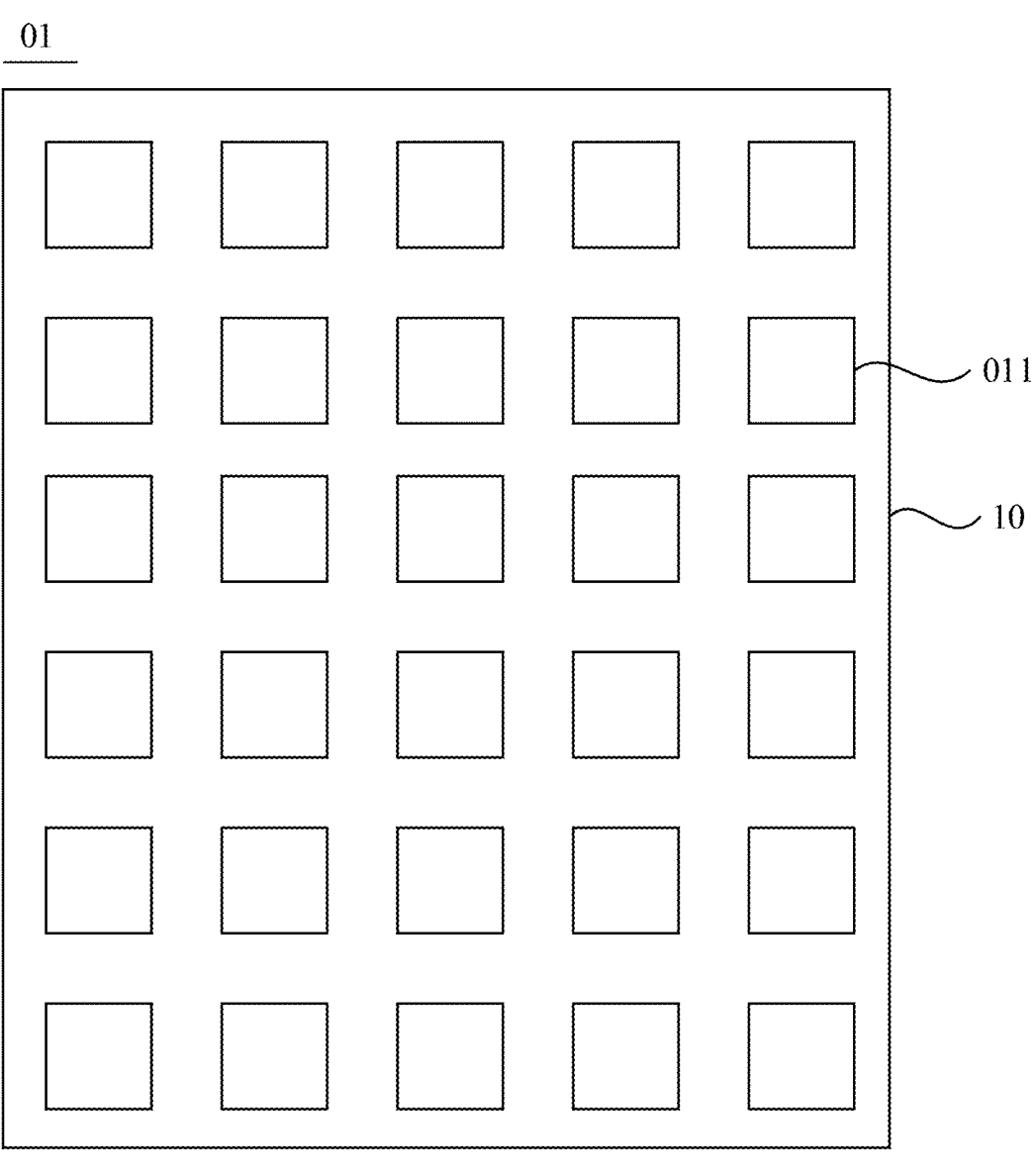
FIG. 24 is a top view illustrating the structure of film layers of a microfluidic chip according to an embodiment of the present disclosure.
Figure 25:
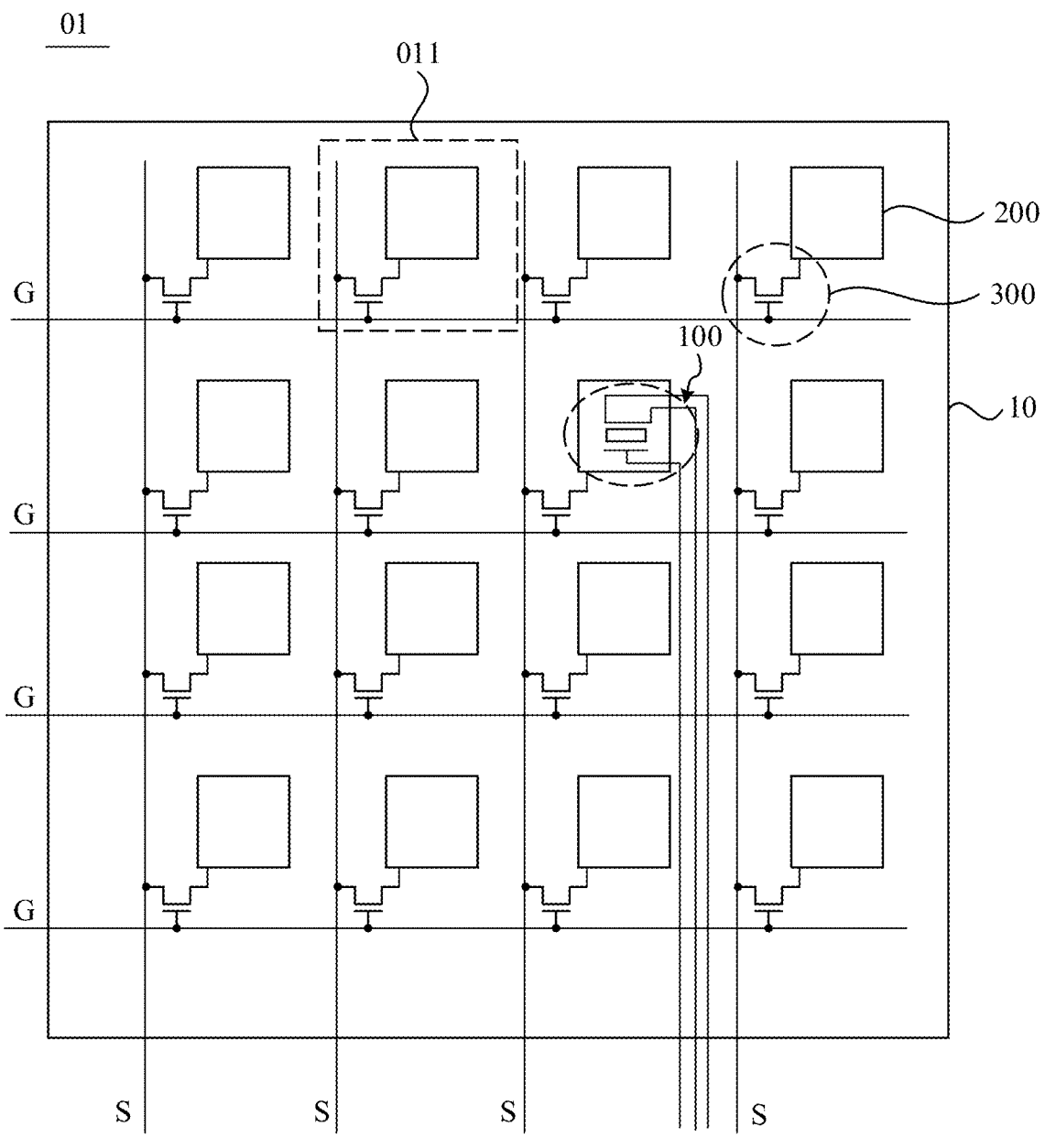
FIG. 25 is a top view illustrating the structure of film layers of a microfluidic chip according to an embodiment of the present disclosure.

An embodiment of the present disclosure further provides a microfluidic chip. FIG. 24 is a top view illustrating the structure of film layers of a microfluidic chip according to an embodiment of the present disclosure, and FIG. 25 is a top view illustrating the structure of film layers of another microfluidic chip according to an embodiment of the present disclosure. Referring to FIG. 24 and FIG. 25, the microfluidic chip 01 includes multiple pixel regions 011 arranged in rows and columns. The microfluidic chip 01 includes at least one microfluidic electrode 200, and each of the at least one microfluidic electrode 200 is located in a pixel region 011 on a side of a substrate 10 and is configured to drive a liquid drop to move. The microfluidic chip 01 includes at least one photosensitive transistor 100 provided in any embodiment of the present disclosure, and each of the at least one photosensitive transistor 100 is located in a pixel region 011 on the side of the substrate 10. Therefore, the microfluidic chip provided in the embodiment of the present disclosure includes the technical features of the photosensitive transistor 100 provided in any embodiment of the present disclosure, and can achieve the beneficial effects of the photosensitive transistor 100 provided in any embodiment of the present disclosure.

Figure 26:
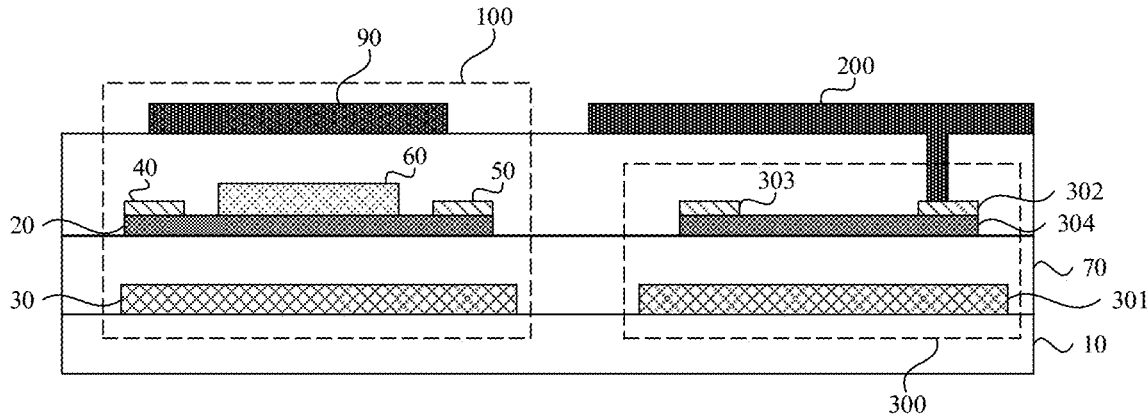
FIG. 26 is a partial cross-sectional view of a microfluidic chip according to an embodiment of the present disclosure.

FIG. 26 is a partial cross-sectional view of a microfluidic chip according to an embodiment of the present disclosure. Referring to FIG. 26, the microfluidic chip 01 further includes at least one microfluidic control transistor 300. each of the at least one microfluidic control transistor 300 includes a third gate 301, a microfluidic source 302, a microfluidic drain 303 and a third semiconductor layer 304, and the microfluidic electrode 200 is electrically connected to the microfluidic source 302. The microfluidic source 302 of the microfluidic control transistor 300 and the microfluidic drain 303 of the microfluidic control transistor 300 may be interchanged, and thus, in another embodiment, the microfluidic electrode 200 may also be electrically connected to the microfluidic drain 303.

Exemplarily, the microfluidic chip 01 includes multiple scanning lines G extending along the row direction and arranged along the column direction and multiple data lines S extending along the column direction and arranged along the row direction. Multiple microfluidic electrodes 200 in the same row may be electrically connected to the same scanning line G, and multiple microfluidic electrodes 200 in the same column may be electrically connected to the same data line S. The scanning line G is electrically connected to the third gate 301 of the microfluidic control transistor 300, and the data line S is electrically connected to the microfluidic drain 303 of the microfluidic control transistor 300.

When a data voltage is applied to the microfluidic electrode 200, the scanning line G electrically connected to the microfluidic electrode 200 turns on the microfluidic control transistor 300, and the data voltage is applied to the microfluidic electrode 200 through the data line S electrically connected to the microfluidic electrode 200.

Optionally, referring to FIG. 26, the photosensitive transistor 100 further includes a second gate 90. The second gate 90 is disposed on a side of a first semiconductor layer 20 away from a first gate 30, and the second gate 90 is transparent in a visible spectrum. The second gate 90 and the microfluidic electrode 200 are disposed in the same layer and insulated from each other.

In an embodiment, to simplify the preparation process of the microfluidic chip, at least one film layer of the photosensitive transistor 100 and at least one film layer of the microfluidic control transistor 300 are prepared in the same layer. The first gate 30 of the photosensitive transistor 100 and the third gate 301 of the microfluidic control transistor 300 may be prepared in the same layer and insulated from each other, the first semiconductor layer 20 of the photosensitive transistor 100 and the third semiconductor layer 304 of the microfluidic control transistor 300 may be prepared in the same layer and insulated from each other, and the first electrode 40 of the photosensitive transistor 100 and the second electrode 50 of the photosensitive transistor 100 and the microfluidic source 302 of the microfluidic control transistor 300 and the microfluidic drain 303 of the microfluidic control transistor 300 may be prepared in the same layer and insulated from each other. The photosensitive transistor 100 may be in a double-gate structure, and the second gate 90 of the photosensitive transistor 100 may be located on the side of the first semiconductor layer 20 away from the first gate 30 and insulated from the first semiconductor layer 20. Since the microfluidic electrode 200 is electrically connected to the microfluidic source 302 of the microfluidic control transistor 300 or the microfluidic drain 303 of the microfluidic control transistor 300, the microfluidic electrode 200 may be disposed on the side of the third semiconductor layer 304 away from the third gate 301. Therefore, the second gate 90 of the photosensitive transistor 100 and the microfluidic electrode 200 may be prepared in the same layer and insulated from each other, facilitating the lightness and thinness of the microfluidic chip 01. The second gate 90 may be made of a transparent conductive material, such as indium tin oxide (ITO); in this manner, the second gate 90 is ensured to be transparent in the visible spectrum, so that the second semiconductor layer 60 is prevented from being shielded, and the photoelectric detection effect of the photosensitive transistor 100 is ensured.

Figure 27:
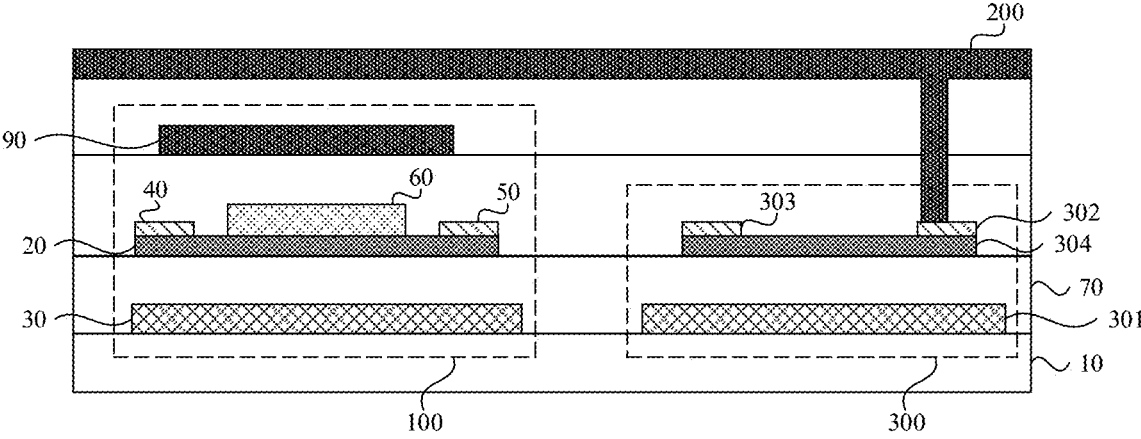
FIG. 27 is a partial cross-sectional view of another microfluidic chip according to an embodiment of the present disclosure.

Optionally, FIG. 27 is a partial cross-sectional view of another microfluidic chip according to an embodiment of the present disclosure. Referring to FIG. 27, the photosensitive transistor 100 further includes a second gate 90, and the second gate 90 is located on a side of a first semiconductor layer 20 away from a first gate 30. The second gate 90 is transparent in the visible spectrum. In a direction perpendicular to a plane where the substrate 10 is located, the second gate 90 is insulated from and overlaps the microfluidic electrode 200.

In an embodiment, the second gate 90 and the microfluidic electrode 200 may also be prepared in different film layers, and an insulating layer is formed between the second gate 90 and the microfluidic electrode 200 so that the second gate 90 and the microfluidic electrode 200 are insulated from each other.

Exemplarily, referring to FIG. 27, a vertical projection of the second gate 90 onto the substrate 10 is located within a vertical projection of the microfluidic electrode 200 onto the substrate 10.

The preceding embodiments do not limit the scope of the present disclosure. It is to be understood by those skilled in the art that various modifications, combinations, sub-combinations and substitutions may be performed according to design requirements and other factors. Any modification, equivalent substitution, improvement and the like made within the spirit and principle of the present disclosure is within the scope of the present disclosure.

What is claimed is:

1. A photosensitive transistor, comprising a substrate and a first semiconductor layer, a first gate, a first electrode, a second electrode and a second semiconductor layer which are located on a side of the substrate, wherein the first semiconductor layer comprises a first doped region, a second doped region and a channel region, and the channel region is located between the first doped region and the second doped region;

the first electrode is electrically connected to the first doped region, the second electrode is electrically connected to the second doped region, and in a direction perpendicular to the substrate, the first gate is insulated from and overlaps the channel region;

the second semiconductor layer is in direct contact with the channel region, and an area of the second semiconductor layer is less than an area of the first semiconductor layer;

the photosensitive transistor comprises a main region and opening regions, and the opening regions are located at a periphery of the main region; the first electrode and the second electrode are in a same layer and insulated from each other and both surround the main region; and a region between an end portion of the first electrode and the second electrode and a region between an end portion of the second electrode and the first electrode each form an opening region of the opening regions; and the second semiconductor layer comprises a main body portion and auxiliary portions, wherein the main body portion is located in the main region, and each of the auxiliary portions is located in an opening region of the opening regions.

2. The photosensitive transistor according to claim 1, wherein for vertical projections of the first electrode, the second electrode and the second semiconductor layer onto the substrate, a first gap exists between a vertical projection of the first electrode and a vertical projection of the second semiconductor layer, and a second gap exists between a vertical projection of the second electrode and a vertical projection of the second semiconductor layer.

3. The photosensitive transistor according to claim 2, wherein for the vertical projections of the first electrode, the second electrode and the second semiconductor layer onto the substrate, a minimum distance between a vertical projection of the main body portion and the vertical projection of the first electrode is a first distance, a minimum distance between a vertical projection of each of the auxiliary portions and the vertical projection of the first electrode is a second distance, and the first distance is equal to the second distance; or wherein for the vertical projections of the first electrode, the second electrode and the second semiconductor layer onto the substrate, a minimum distance between a vertical projection of the main body portion and the vertical projection of the second electrode is a third distance, a minimum distance between a vertical projection of each of the auxiliary portions and the vertical projection of the second electrode is a fourth distance, and the third distance is equal to the fourth distance.

4. The photosensitive transistor according to claim 1, wherein in the direction perpendicular to the substrate, a thickness of the main body portion is equal to a thickness of the auxiliary portions.

5. The photosensitive transistor according to claim 1, wherein a third gap exists between the main body portion and each of the auxiliary portions.

6. The photosensitive transistor according to claim 1, wherein the second semiconductor layer further comprises connection portions, and each of the connection portions connects the main body portion and an auxiliary portion of the auxiliary portions.

7. The photosensitive transistor according to claim 6, wherein for vertical projections of the first electrode and the second semiconductor layer onto the substrate, a minimum distance between a vertical projection of the main body portion and a vertical projection of the first electrode is a first distance, a minimum distance between a vertical projection of a connection portion of the connection portions and the vertical projection of the first electrode is a fifth distance, and the first distance is equal to the fifth distance; or wherein for vertical projections of the second electrode and the second semiconductor layer onto the substrate, a minimum distance between a vertical projection of the main body portion and a vertical projection of the second electrode is a third distance, a minimum distance between a vertical projection of a connection portion of the connection portions and the vertical projection of the second electrode is a sixth distance, and the third distance is equal to the sixth distance.

8. The photosensitive transistor according to claim 6, wherein in the direction perpendicular to the substrate, a thickness of the main body portion is equal to a thickness of the connection portions.

9. The photosensitive transistor according to claim 1, wherein the first electrode comprises a first sub-electrode and a second sub-electrode which are connected to each other, and the second electrode comprises a third sub-electrode and a fourth sub-electrode which are connected to each other;

the first sub-electrode and the third sub-electrode both extend along a first direction, the second sub-electrode and the fourth sub-electrode both extend along a second direction, and the first direction intersects the second direction;

the second sub-electrode and the fourth sub-electrode are arranged along the first direction; and the first sub-electrode and the third sub-electrode are arranged along the second direction; and along the second direction, a region between an end portion of the fourth sub-electrode and an end portion of the first sub-electrode forms an opening region of the opening regions, and a region between an end portion of the second sub-electrode and an end portion of the third sub-electrode forms another opening region of the opening regions.

10. The photosensitive transistor according to claim 1, wherein the first electrode comprises a first sub-electrode, a second sub-electrode and a third sub-electrode, an end of the first sub-electrode is connected to the second sub-electrode, and an end of the third sub-electrode is connected to the second sub-electrode;

the second electrode comprises a fourth sub-electrode and a fifth sub-electrode, and an end of the fifth sub-electrode is connected to the fourth sub-electrode;

the second sub-electrode and the fourth sub-electrode both extend along a first direction, the first sub-electrode, the third sub-electrode and the fifth sub-electrode extend along a second direction, and the first direction intersects the second direction;

along the first direction, the fifth sub-electrode is located between the first sub-electrode and the third sub-electrode; and the second sub-electrode and the fourth sub-electrode are arranged along the second direction; and along the second direction, a region between an end portion of the first sub-electrode and the fourth sub-electrode forms an opening region of the opening regions, a region between an end portion of the fifth sub-electrode and the second sub-electrode forms another opening region of the opening regions, and a region between an end portion of the third sub-electrode and the fourth sub-electrode forms another opening region of the opening regions.

11. The photosensitive transistor according to claim 10, wherein an end of the second sub-electrode is connected to the first sub-electrode, and the other end of the second sub-electrode is connected to the third sub-electrode.

12. The photosensitive transistor according to claim 10, wherein the second electrode further comprises a sixth sub-electrode, an end of the fourth sub-electrode is connected to an end of the sixth sub-electrode, and the sixth sub-electrode extends along the second direction;

along the first direction, the fifth sub-electrode is located between the first sub-electrode and the third sub-electrode, and the third sub-electrode is located between the sixth sub-electrode and the fifth sub-electrode; and along the second direction, a region between an end portion of the sixth sub-electrode and an end portion of the second sub-electrode forms an opening region of the opening regions.

13. The photosensitive transistor according to claim 1, wherein for vertical projections of the first semiconductor layer and the second semiconductor layer onto the substrate, a vertical projection of an edge of the first semiconductor layer is located between a vertical projection of an edge of an auxiliary portion of the auxiliary portions and a vertical projection of the main body portion.

14. The photosensitive transistor according to claim 1, wherein the first electrode, the second electrode and the second semiconductor layer are located on a same side of the first semiconductor layer.

15. The photosensitive transistor according to claim 1, wherein the first electrode and the second electrode are located on a same side of the first semiconductor layer; and the first semiconductor layer is located between the first electrode and the second semiconductor layer.

16. The photosensitive transistor according to claim 1, wherein the first gate, the first electrode and the second electrode are located on a same side of the first semiconductor layer.

17. The photosensitive transistor according to claim 1, wherein the first semiconductor layer and the second semiconductor layer have a same material.

18. A method for manufacturing the photosensitive transistor according to claim 1, comprising:
forming the first gate;
forming a gate insulating layer;

forming the first semiconductor layer and the second semiconductor layer, wherein the area of the second semiconductor layer is less than the area of the first semiconductor layer;

doping on part of the first semiconductor layer which is not covered by the second semiconductor layer to form the first doped region, the channel region and the second doped region, wherein the channel region is located between the first doped region and the second doped region; and forming the first electrode electrically connected to the first doped region and the second electrode electrically connected to the second doped region; wherein the photosensitive transistor comprises the main region and opening regions, and the opening regions are located at the periphery of the main region; the first electrode and the second electrode are in the same layer and insulated from each other and both surround the main region; and the region between the end portion of the first electrode and the second electrode and the region between the end portion of the second electrode and the first electrode each form the opening region of the opening regions; and the second semiconductor layer comprises the main body portion and auxiliary portions, wherein the main body portion is located in the main region, and each of the auxiliary portions is located in the opening region of the opening regions.

19. The method according to claim 18, wherein forming the first semiconductor layer and the second semiconductor layer comprises:

forming an original semiconductor layer by a film-forming process;

etching the original semiconductor layer to expose part of the gate insulating layer to form a patterned semiconductor layer; and etching part of the patterned semiconductor layer in a thickness direction in part of the main region and part of each of the opening regions to form the first semiconductor layer and the second semiconductor layer.

20. A microfluidic chip, comprising a plurality of pixel regions arranged in rows and columns;

at least one microfluidic electrode, wherein each of the at least one microfluidic electrode is located in a pixel region of the plurality of pixel regions on a side of a substrate and is configured to drive a liquid drop to move; and at least one photosensitive transistor, wherein each photosensitive transistor of the at least one photosensitive transistor is located in a pixel region of the plurality of pixel regions on the side of the substrate;

wherein the each photosensitive transistor comprises the substrate and a first semiconductor layer, a first gate, a first electrode, a second electrode and a second semiconductor layer which are located on the side of the substrate, wherein the first semiconductor layer comprises a first doped region, a second doped region and a channel region, and the channel region is located between the first doped region and the second doped region;

the first electrode is electrically connected to the first doped region, the second electrode is electrically connected to the second doped region, and in a direction perpendicular to the substrate, the first gate is insulated from and overlaps the channel region;

the second semiconductor layer is in direct contact with the channel region, and an area of the second semiconductor layer is less than an area of the first semiconductor layer;

the photosensitive transistor comprises a main region and opening regions, and the opening regions are located at a periphery of the main region; the first electrode and the second electrode are in a same layer and insulated from each other and both surround the main region; and a region between an end portion of the first electrode and the second electrode and a region between an end portion of the second electrode and the first electrode each form an opening region of the opening regions; and the second semiconductor layer comprises a main body portion and auxiliary portions, wherein the main body portion is located in the main region, and each of the auxiliary portions is located in an opening region of the opening regions; wherein the each photosensitive transistor further comprises a second gate, the second gate is located on a side of the first semiconductor layer away from the first gate, and the second gate is transparent in a visible spectrum.

* * * * *